(12) United States Patent
Petti

(10) Patent No.: US 9,099,385 B2
(45) Date of Patent: Aug. 4, 2015

(54) VERTICAL 1T-1R MEMORY CELLS, MEMORY ARRAYS AND METHODS OF FORMING THE SAME

(71) Applicant: SanDisk 3D LLC, Milpitas, CA (US)

(72) Inventor: Christopher J. Petti, Mountain View, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/075,010

(22) Filed: Nov. 8, 2013

(65) Prior Publication Data

US 2015/0131360 A1    May 14, 2015

(51) Int. Cl.
| | |
|---|---|
| G11C 11/00 | (2006.01) |
| H01L 27/24 | (2006.01) |
| G11C 13/00 | (2006.01) |
| H01L 45/00 | (2006.01) |
| H01L 21/8234 | (2006.01) |

(52) U.S. Cl.
CPC ........ *H01L 27/2481* (2013.01); *G11C 13/0002* (2013.01); *H01L 21/823487* (2013.01); *H01L 27/2454* (2013.01); *H01L 45/145* (2013.01); *H01L 45/16* (2013.01)

(58) Field of Classification Search
CPC ............................ G11C 13/0069; G11C 11/16
USPC .................................................. 365/148, 158
See application file for complete search history.

(56) References Cited

U.S. PATENT DOCUMENTS

| | | | | |
|---|---|---|---|---|
| 4,433,471 | A * | 2/1984 | Ko et al. ....................... | 438/327 |
| 6,246,083 | B1 * | 6/2001 | Noble ........................... | 257/296 |
| 7,754,605 | B2 * | 7/2010 | Herner et al. ................ | 438/656 |
| 7,848,145 | B2 * | 12/2010 | Mokhlesi et al. ........ | 365/185.17 |
| 8,233,309 | B2 | 7/2012 | Fasoli | |
| 8,294,131 | B2 * | 10/2012 | Kim et al. ......................... | 257/2 |
| 8,319,294 | B2 * | 11/2012 | Hold ............................ | 257/401 |
| 8,369,177 | B2 * | 2/2013 | Hold et al. ............... | 365/230.03 |
| 8,471,232 | B2 | 6/2013 | Kim et al. | |
| 8,482,041 | B2 * | 7/2013 | Masuoka et al. ............. | 257/255 |
| 8,513,102 | B2 * | 8/2013 | Forbes et al. ................ | 438/514 |
| 8,581,333 | B2 * | 11/2013 | Takeuchi ..................... | 257/329 |
| 8,625,348 | B2 * | 1/2014 | Lee et al. ................. | 365/185.05 |
| 8,674,430 | B2 * | 3/2014 | Yasuda et al. ................. | 257/325 |

* cited by examiner

*Primary Examiner* — Michael Tran
(74) *Attorney, Agent, or Firm* — Vierra Magen Marcus LLP

(57) ABSTRACT

Vertical 1T-1R memory cells, memory arrays of vertical 1T-1R memory calls, and methods of forming such memory cells and memory arrays are described. The memory cells each include a vertical transistor and a resistivity-switching element coupled in series with and disposed above or below the vertical transistor. The vertical transistor includes a controlling electrode coupled to a word line that is above or below the vertical transistor. The controlling electrode is disposed on a sidewall of the vertical transistor. Each vertical transistor includes a first terminal coupled to a bit line, a second terminal comprising the controlling electrode coupled to a word line, and a third terminal coupled to the resistivity-switching element.

33 Claims, 33 Drawing Sheets

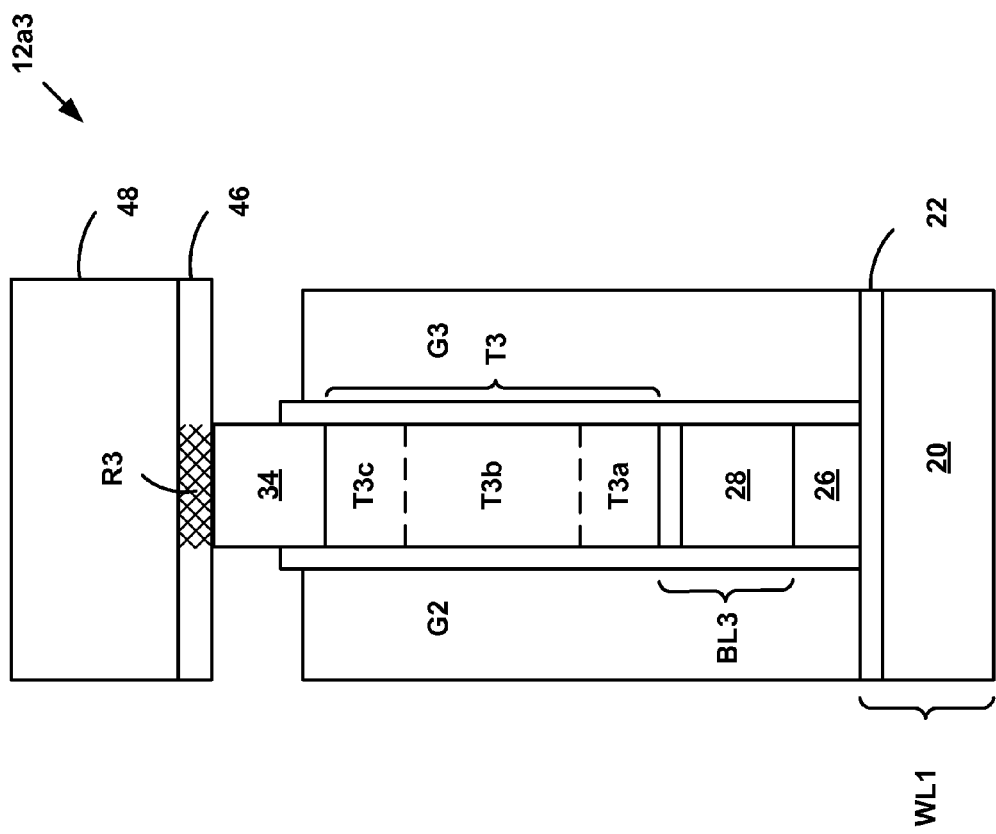

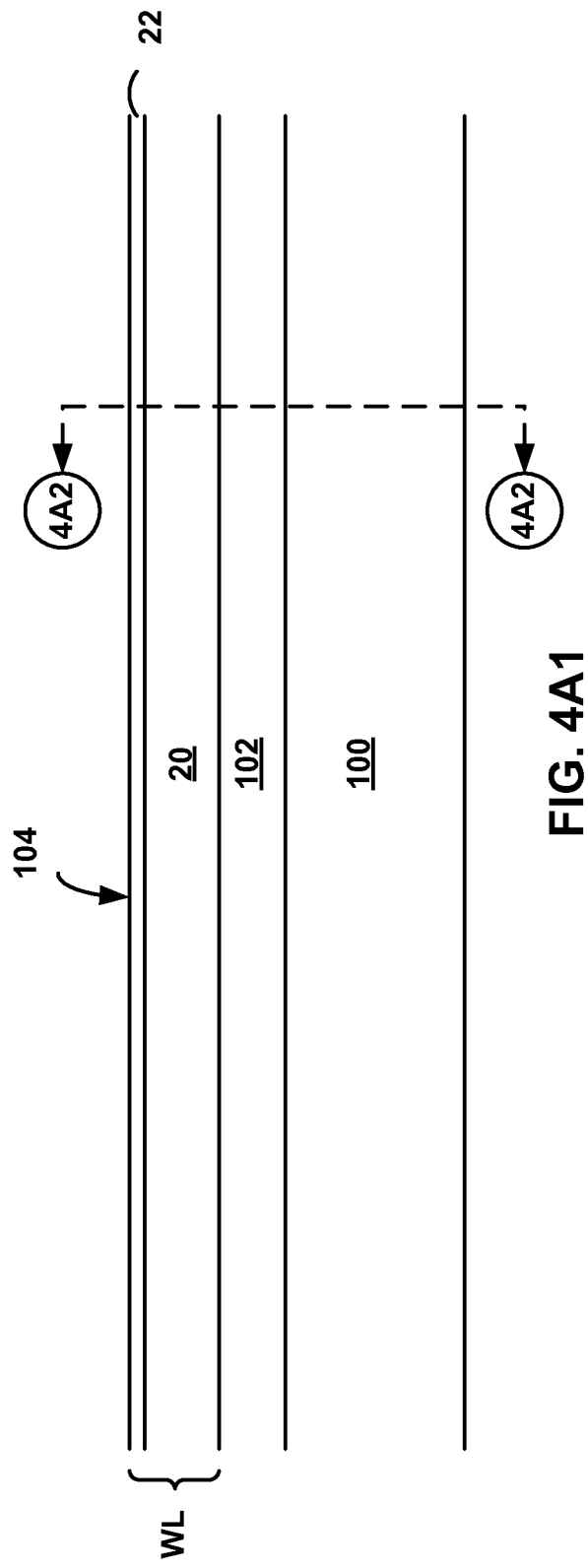
FIG. 4A1

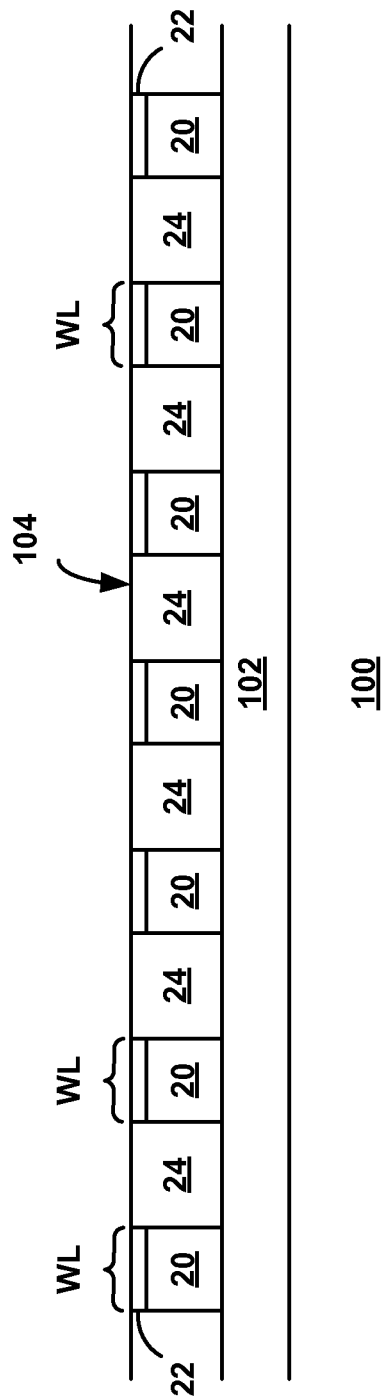
FIG. 4A2

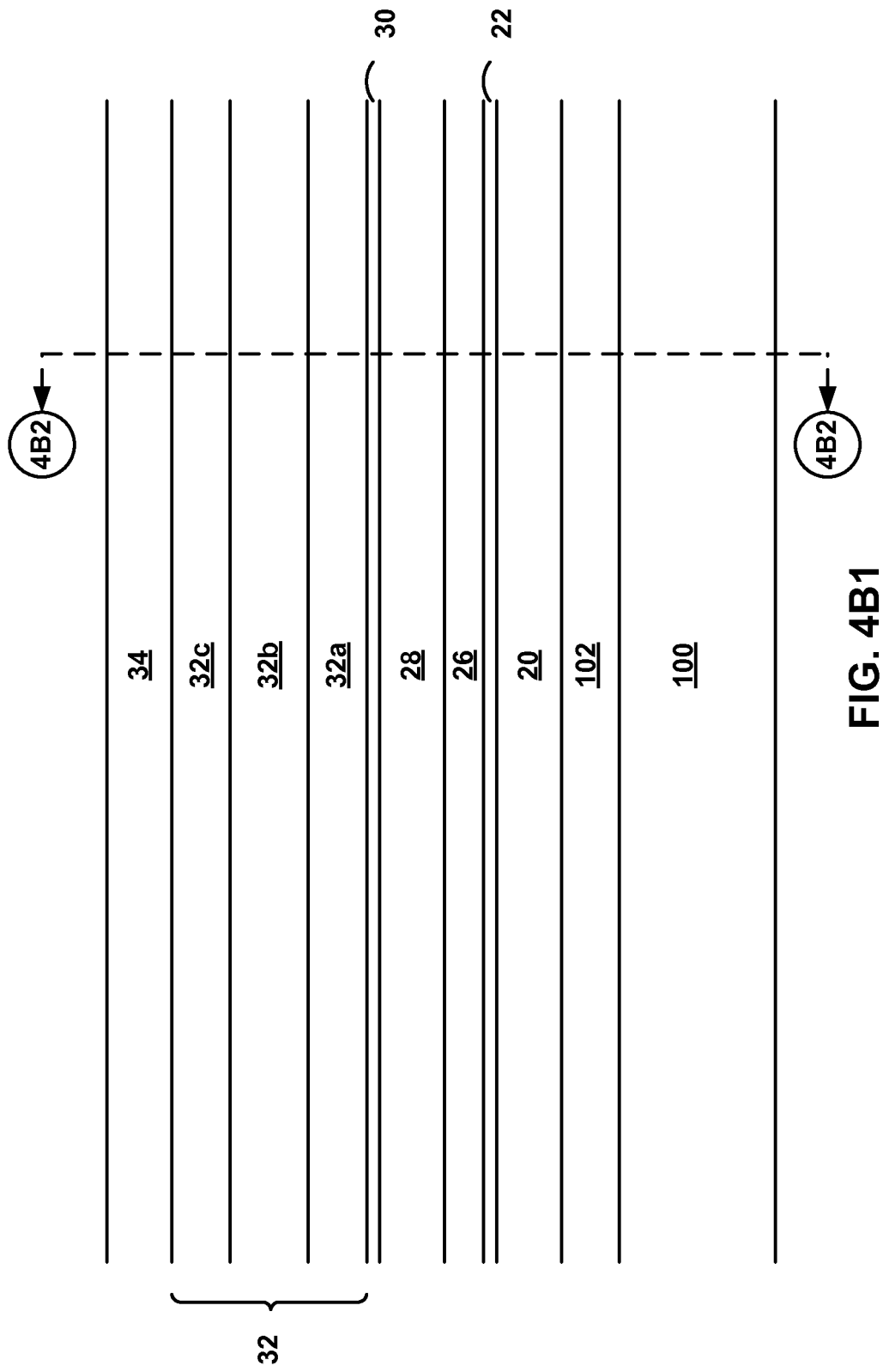

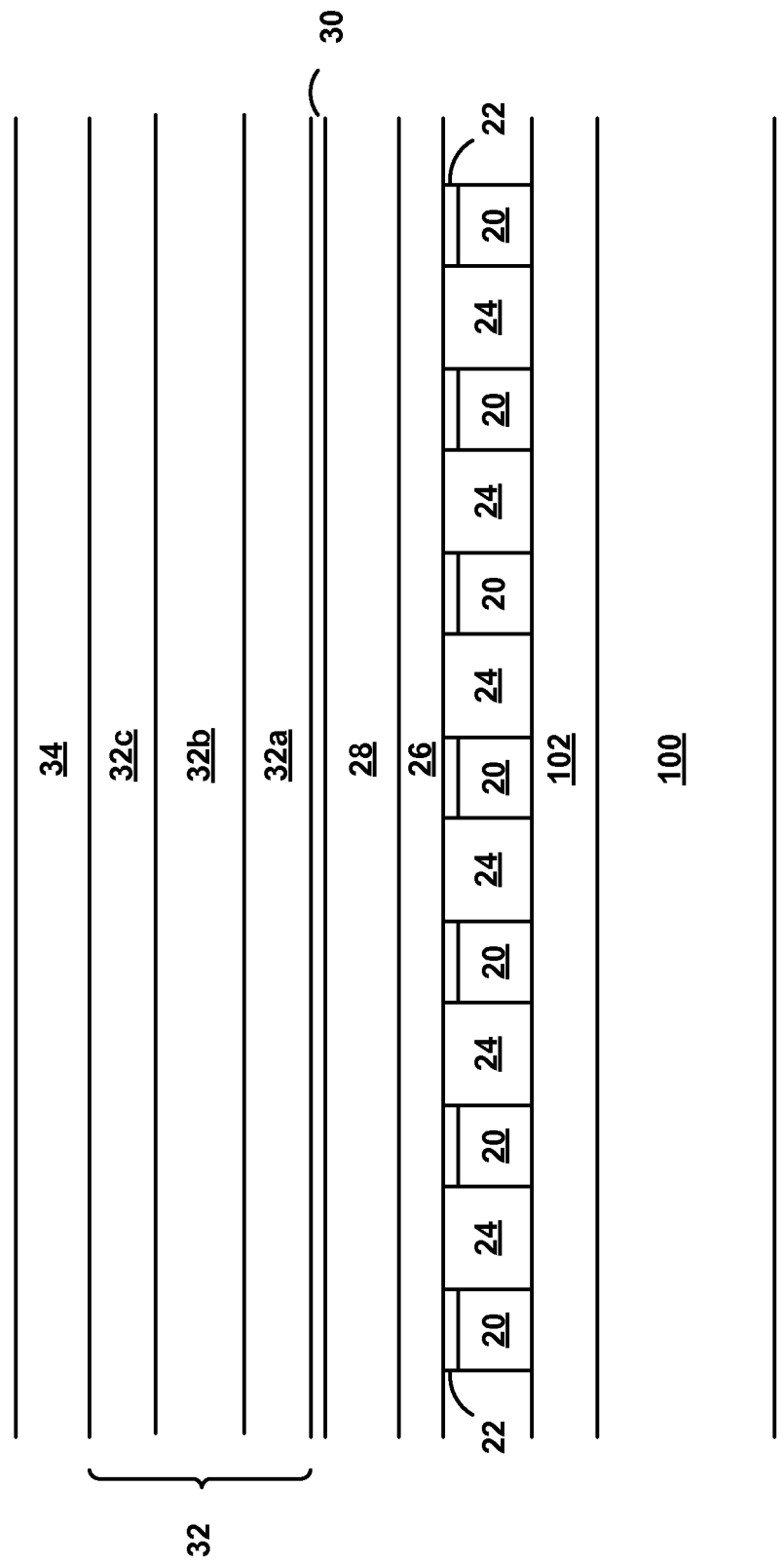
FIG. 4B2

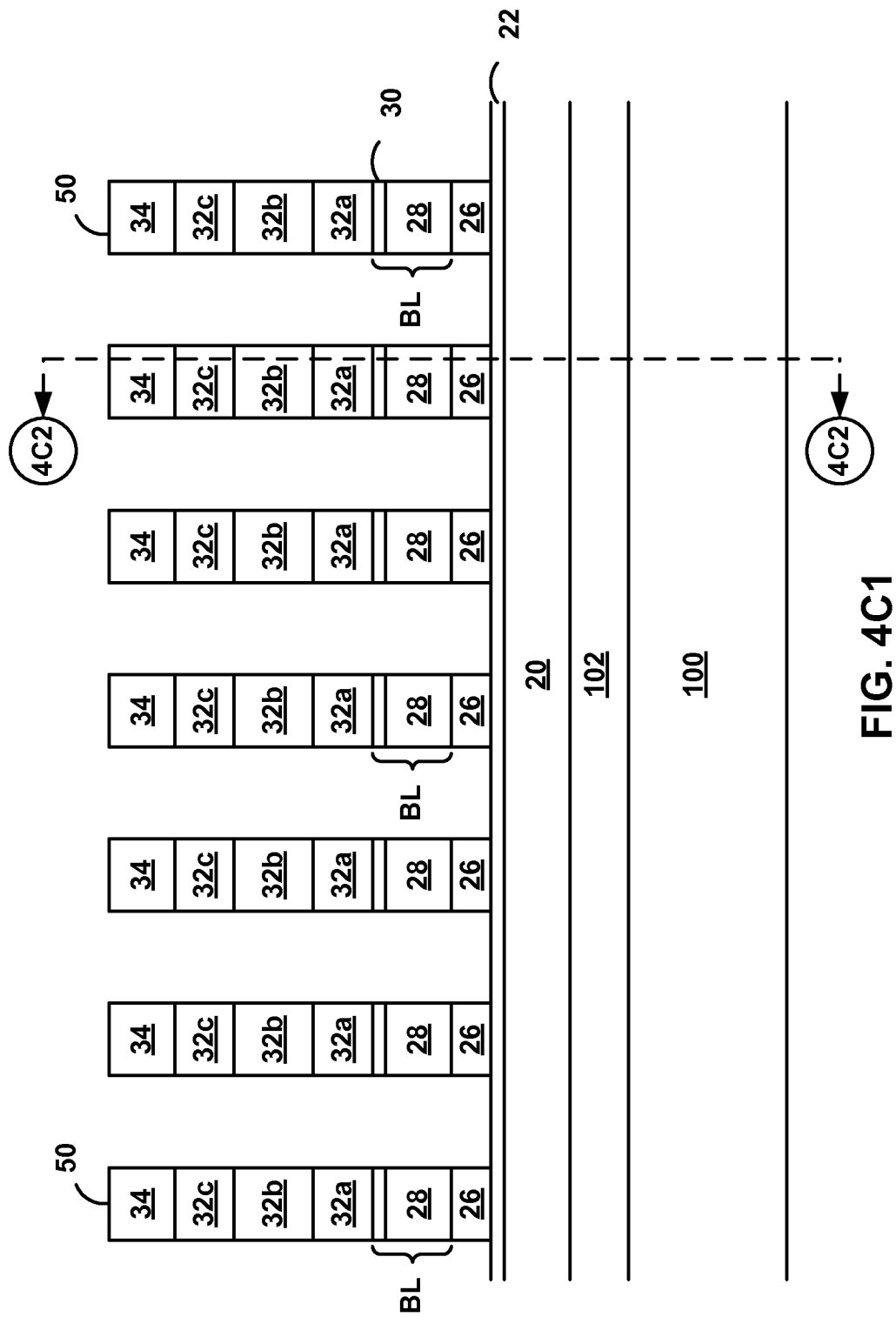
FIG. 4C1

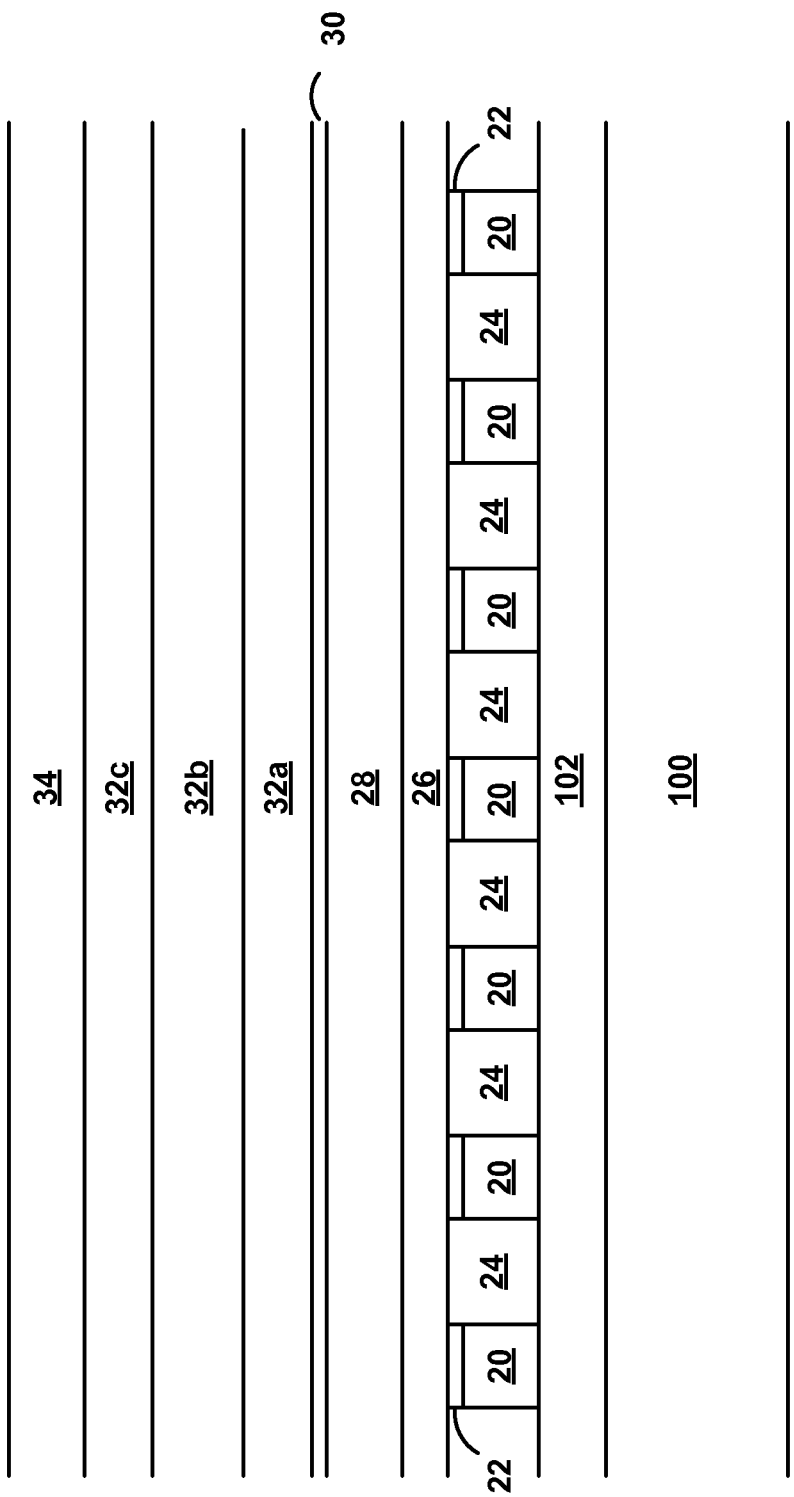
FIG. 4C2

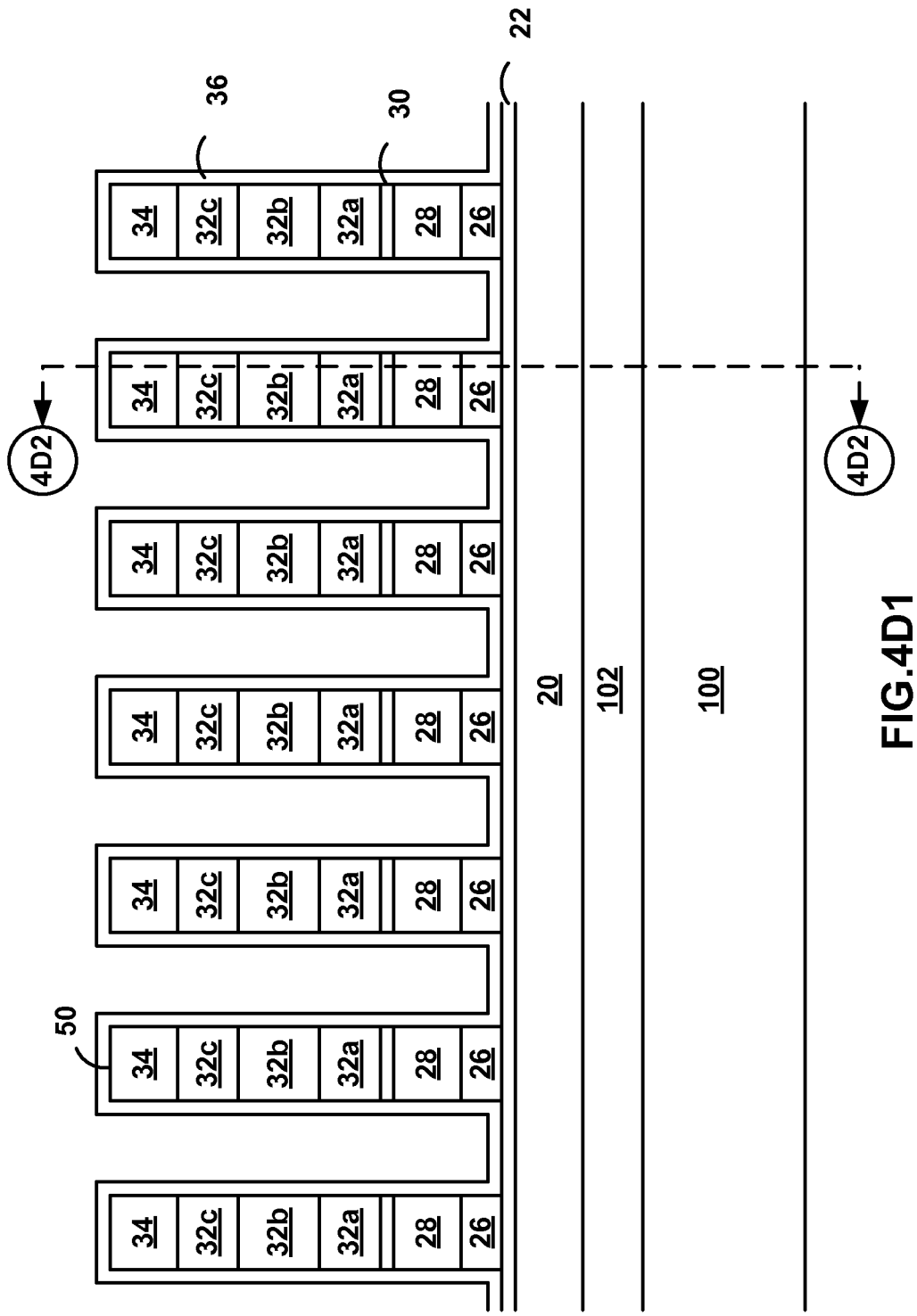
FIG. 4D1

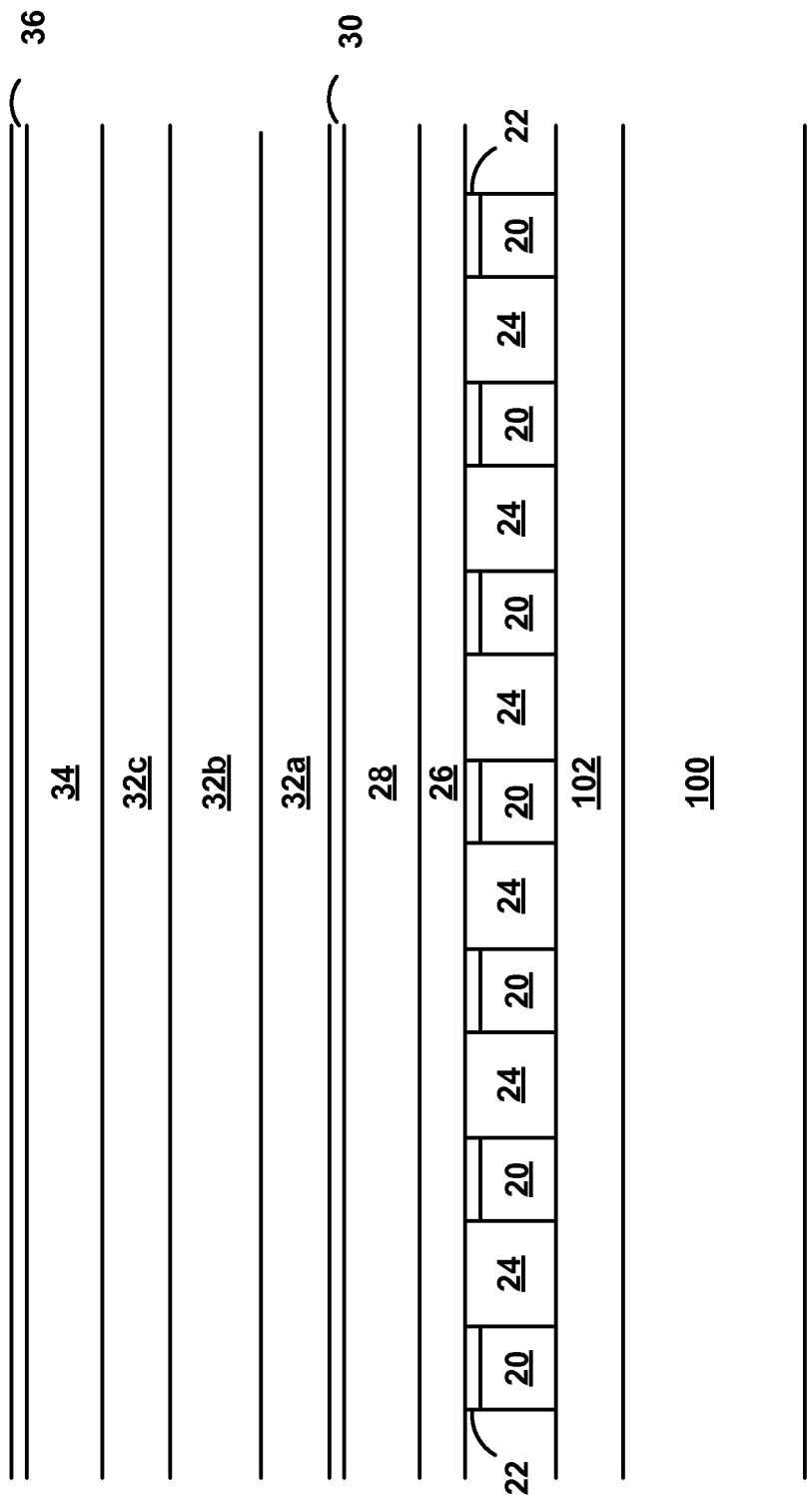

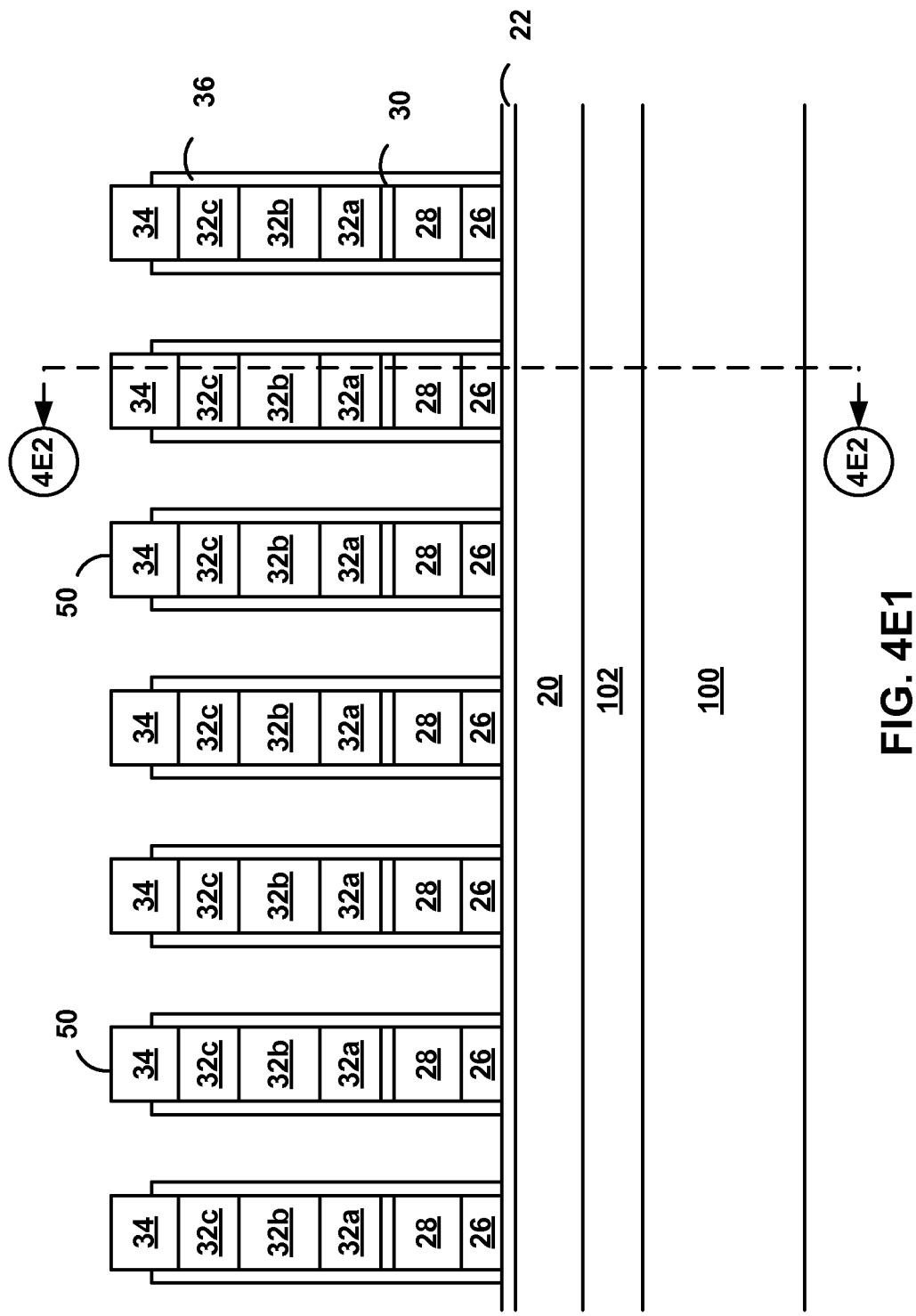

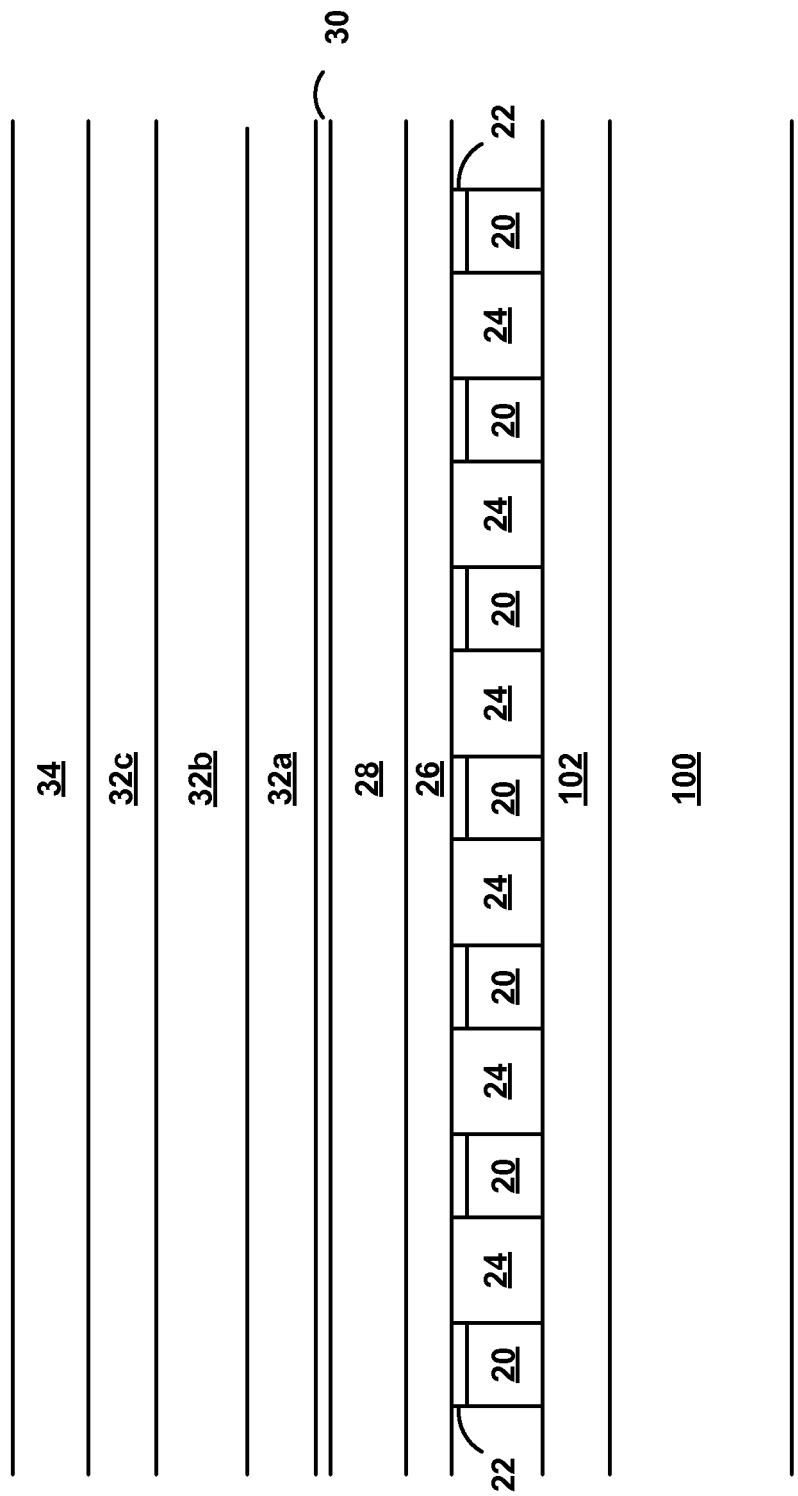

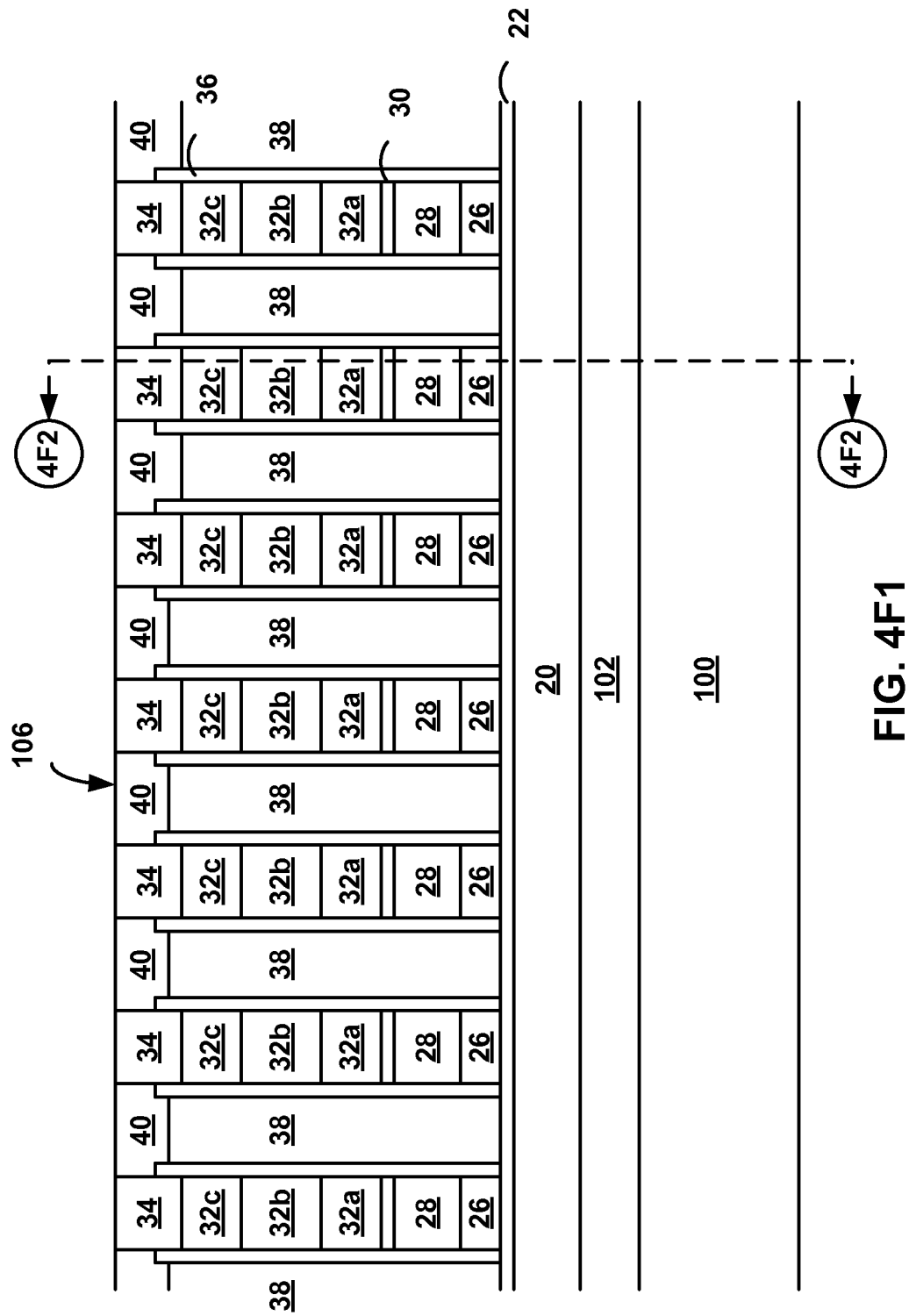
FIG. 4F1

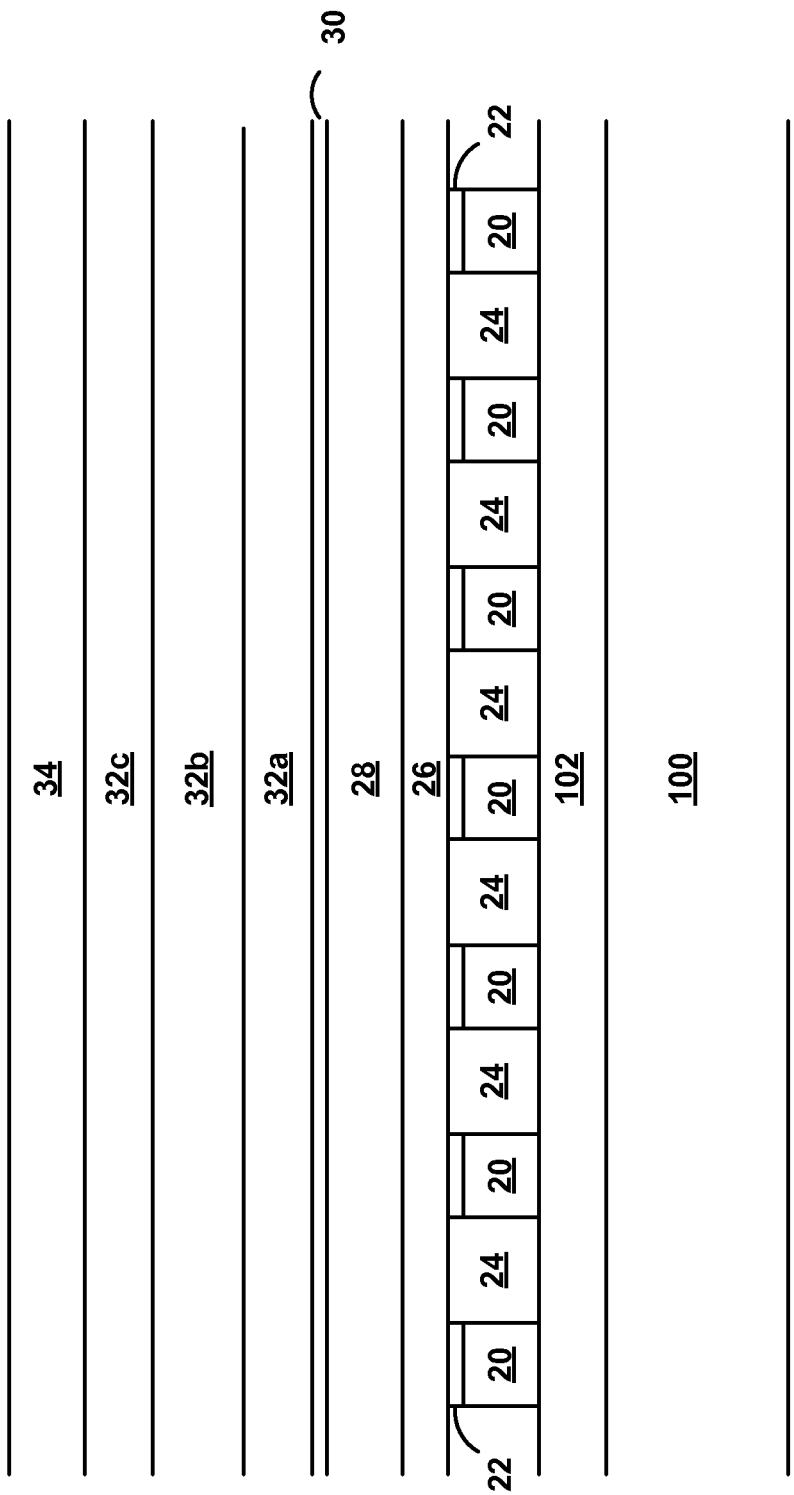
FIG. 4F2

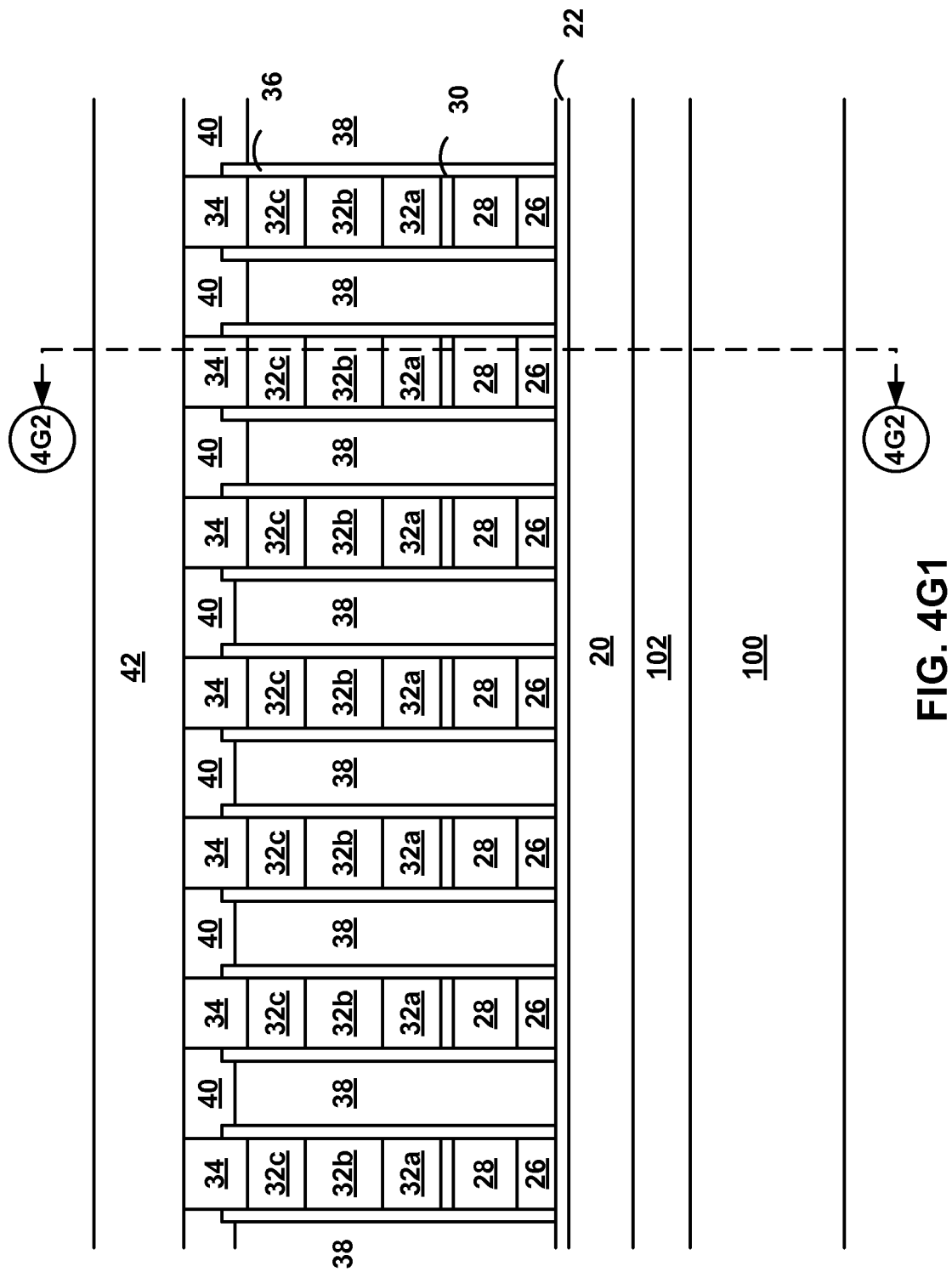

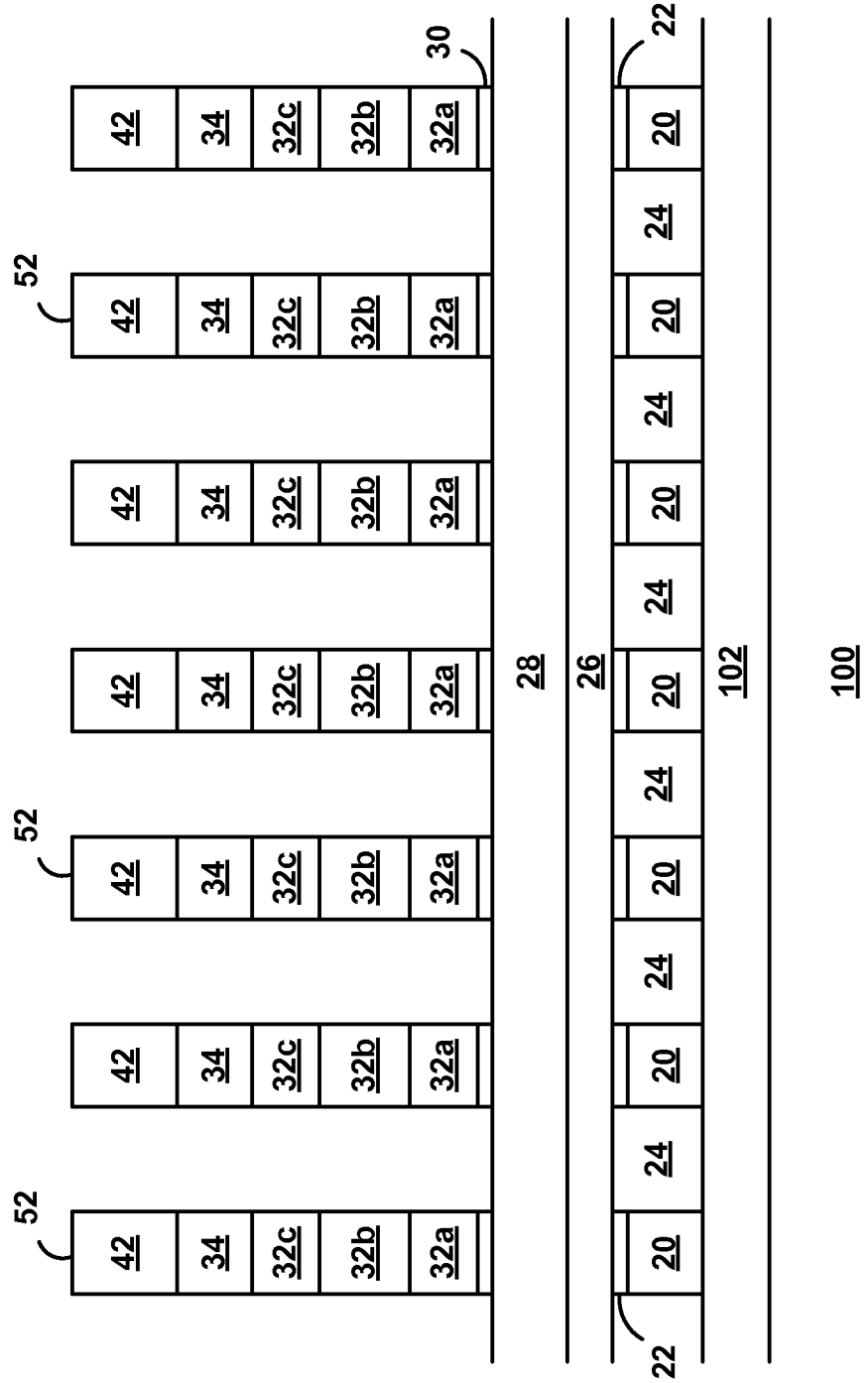
FIG. 4G2

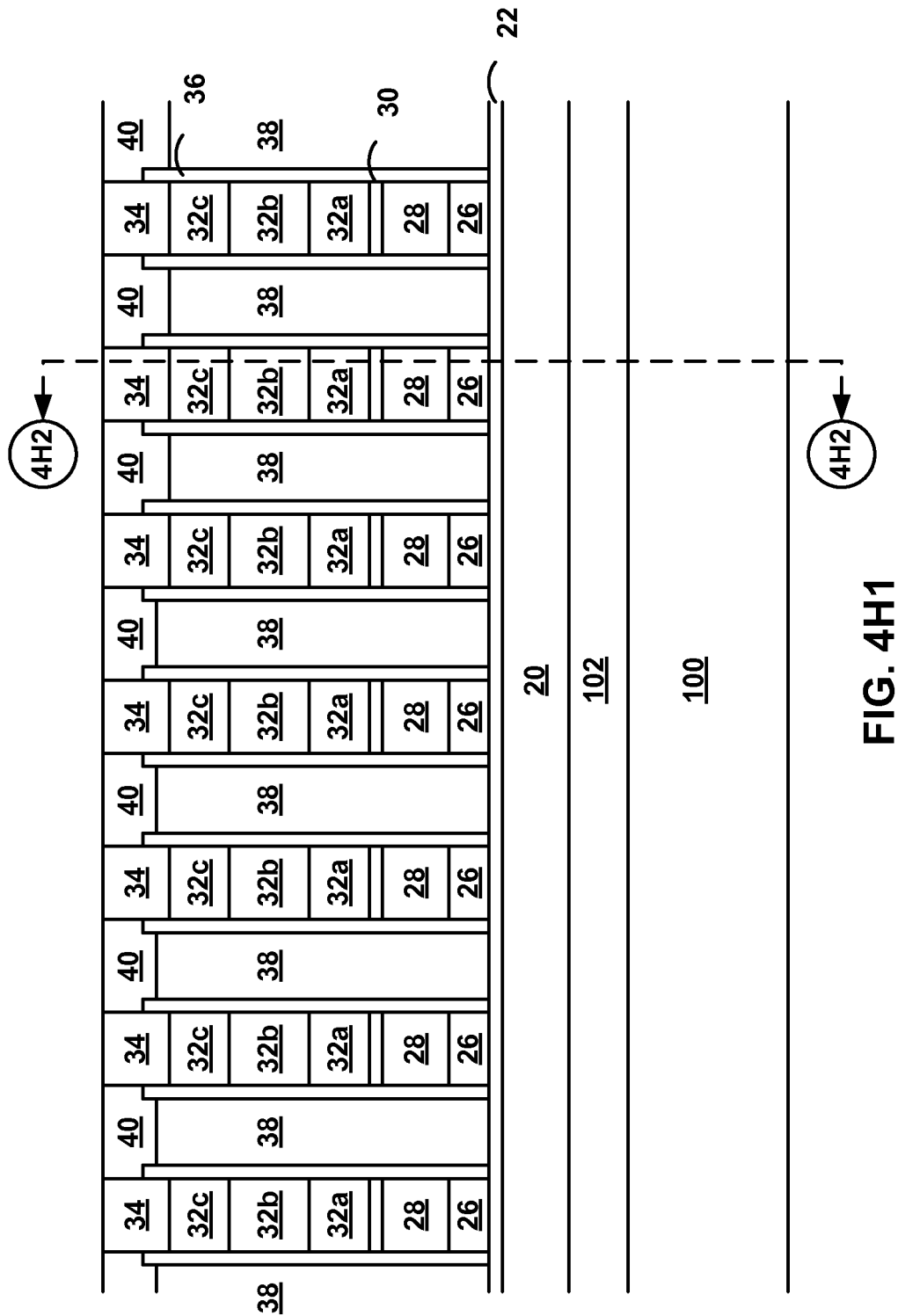
FIG. 4H1

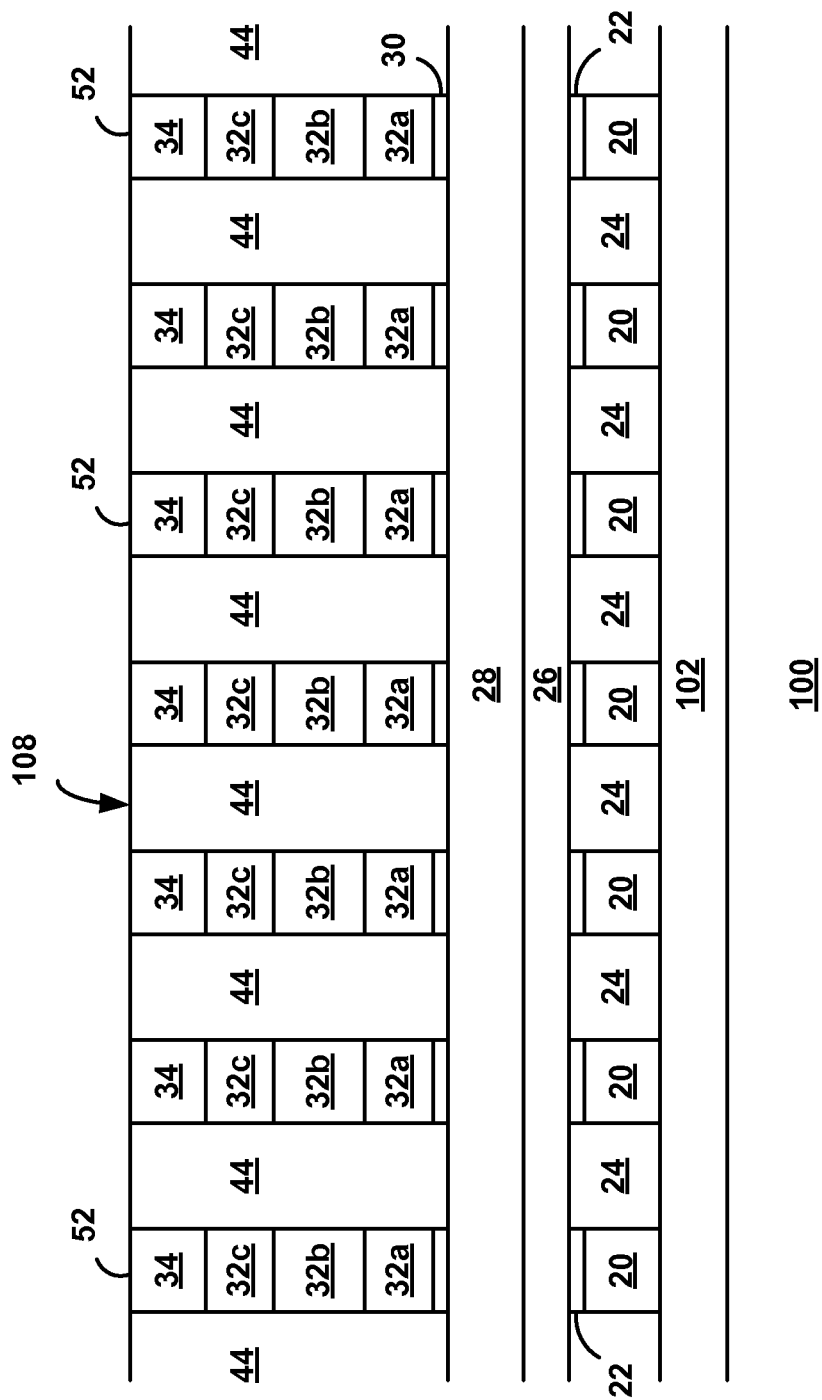
FIG. 4H2

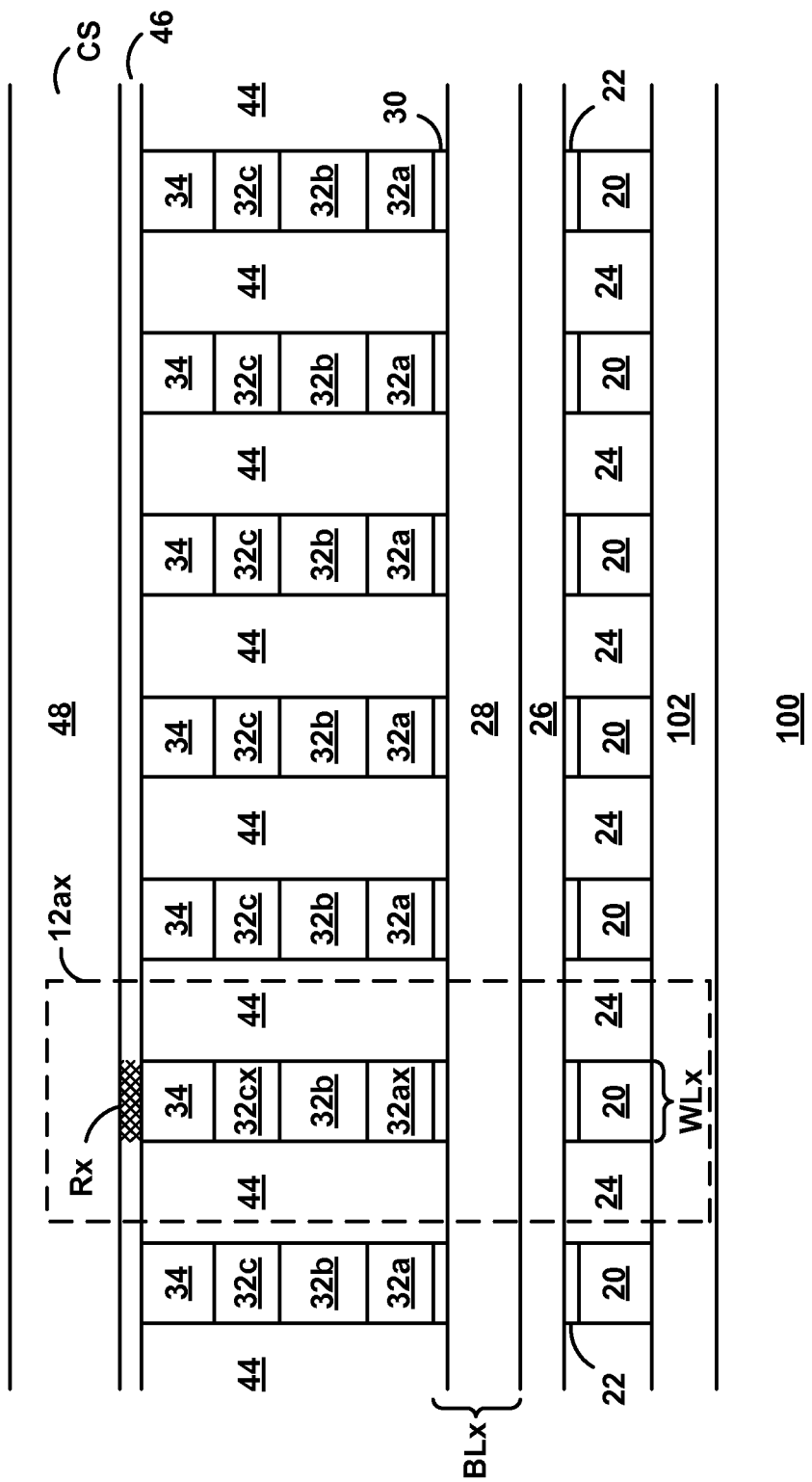
FIG. 4I2

VERTICAL 1T-1R MEMORY CELLS, MEMORY ARRAYS AND METHODS OF FORMING THE SAME

BACKGROUND

This application relates to technology for non-volatile data storage having reversible resistivity-switching behavior.

A variety of materials show reversible resistivity-switching behavior, and may be suitable for use in resistance-switching memory devices, sometimes referred to as "ReRAM" devices. Transition metal oxides exhibit reversible resistivity-switching behavior, and have been proposed for use in ReRAM devices. Upon application of sufficient voltage, current, or other stimulus, the reversible resistivity-switching material switches to a stable low-resistance state. This resistivity-switching is reversible, such that subsequent application of an appropriate voltage, current, or other stimulus can return the reversible resistivity-switching material to a stable high-resistance state. This conversion can be repeated many times. The low resistance state is sometimes referred to as an "ON" state, and the high resistance state is sometimes referred to as an "OFF" state. For some switching materials, the initial state is low-resistance rather than high-resistance.

ReRAM devices may be used in nonvolatile memory arrays. One type of memory array is referred to as a cross-point array, which is a matrix of memory elements typically arranged along x-axes (e.g., word lines) and along y-axes (e.g., bit lines). A digital value may be stored as a memory resistance (HIGH or LOW). The memory state of a memory cell can be read by supplying appropriate voltages to the bit line and word line connected to the selected memory element. The resistance or memory state can be read as an output voltage or current of the bit line connected to the selected memory cell. One resistance state may correspond to a data "0," for example, whereas the other resistance state corresponds to a data "1." Some switching materials may have more than two stable resistance states, and thus may be used to represent more than one bit of data.

ReRAM memory arrays may be formed in a variety of different configurations. For example, a ReRAM array may be formed as a simple cross-point array of the ReRAM devices themselves. Such a memory array is able to fit one physical bit in a minimum area ($4F^2$, where "F" is the minimum feature size). However, such an array of ReRAM devices is severely limited in size. This is because, when addressing an individual bit, there are many "sneak paths" through the memory array that can make sensing the state of the selected bit difficult. This can be helped if there is some non-linearity in the ReRAM device's current-voltage characteristics, but that adds a constraint on the device design.

Alternatively, a ReRAM memory array may be formed as a cross-point array with a two-terminal selecting element—such as a diode—in series with each ReRAM device. This configuration allows larger arrays (as sneak paths are suppressed), but to write a bit, most of the unselected bits are reverse biased. Thus, the leakage current of the selection diode must be very low to allow low-current (and thus high speed) operation. Moreover, using a diode does not allow effective current limiting during the write operation. Many resistivity-switching memory materials can advantageously utilize such current limiting to reduce write and erase power, and possibly to allow multi-bit operation.

Another alternative ReRAM memory array configuration is a one-transistor, one-resistor ("1T-1R") array, wherein a transistor is connected between each ReRAM device and a common terminal. The gate of the transistors are connected together to form the word lines. Such an array can effectively limit the current of a ReRAM device, and can possibly provide multi-level operation. Leakage currents in such arrays are limited to drain-source leakage along the selected bit lines, and gate-source leakage along the selected word line. All completely unselected bits have gate-to-source voltages and drain-to-source voltages of zero. Each bit can be written, erased, or read individually. However, for a typical horizontal transistor, such a cell has a footprint of, at best, $6F^2$.

BRIEF DESCRIPTION OF THE DRAWINGS

FIG. 2D is a cross-sectional view of a memory cell of the example memory array of FIG. 1A.

FIGS. 4A1-4I2 are cross-sectional views of a portion of a substrate during an example fabrication of the memory array of FIGS. 2B-2C.

DETAILED DESCRIPTION

Vertical 1T-1R memory cells, memory arrays of vertical 1T-1R memory calls, and methods of forming such memory cells and memory arrays are described. In particular, memory cells are described that include a vertical transistor and a resistivity-switching element coupled in series with and disposed above or below the vertical transistor. The vertical transistor includes a controlling electrode that is coupled to a word line disposed above or below the vertical transistor. The vertical transistor also includes a first terminal coupled to a bit line, a second terminal including the controlling electrode coupled to a word line, and a third terminal coupled to the resistivity-switching element.

Memory arrays of 1T-1R memory cells are described that include word lines arranged in parallel along a first axis, bit lines arranged in parallel along a second axis perpendicular to the first axis, and memory cells formed at each intersection of one of the word lines and one of the bit lines. Each memory cell includes a vertically-oriented pillar-shaped transistor coupled in series with and disposed above or below a resistivity-switching element. Each vertical transistor has a controlling electrode coupled to one of the word lines and disposed on a sidewall of a corresponding one of the vertically-oriented pillar-shaped transistors.

In one embodiment, the bit lines are above the word lines, the vertically-oriented pillar-shaped transistors are above the bit lines, and the resistivity-switching elements are above the vertically-oriented pillar-shaped transistors. In an alternative embodiment, the vertically-oriented pillar-shaped transistors are above the resistivity-switching elements, the bit lines are above the vertically-oriented pillar-shaped transistors, and the word lines are above the bit lines.

Methods of forming 1T-1R memory arrays also are described. The methods include using three masking steps to form an array of memory cells, each memory cell formed at an intersection of one of a plurality of word lines and one of a plurality of bit lines. Each memory cell includes a vertically-oriented pillar-shaped transistor coupled in series with and disposed above or below a resistivity-switching element.

Example Memory Arrays

Figure 1A:
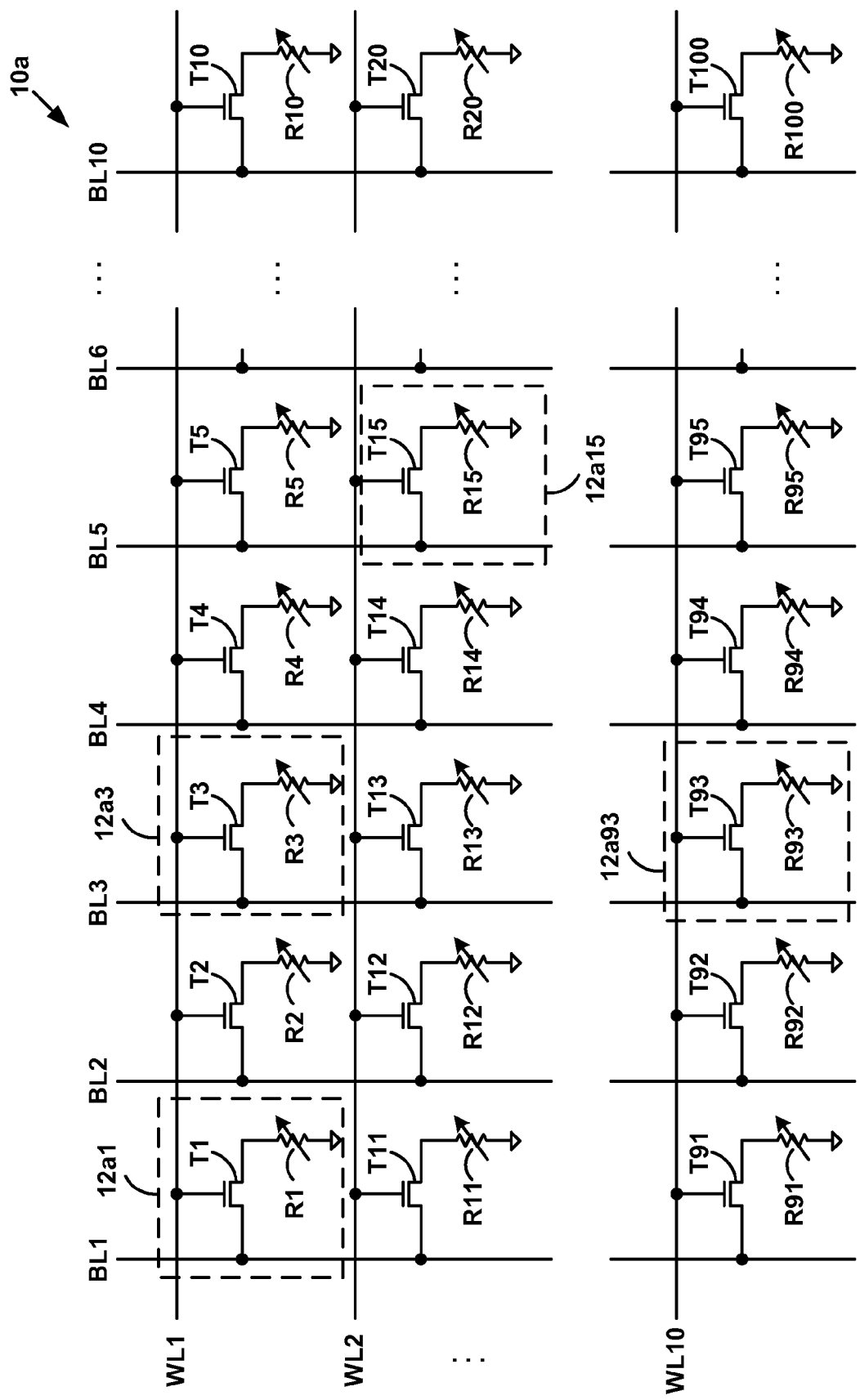
FIGS. 1A-1D are simplified schematic diagrams of example embodiments of memory arrays.

FIG. 1A is a simplified schematic diagram of an example cross-point memory array 10a that includes word lines WL1, WL2, ..., WL10, bit lines BL1, BL2, ..., BL10, and memory cells 12a1, 12a2, ..., 12a100, coupled to the word lines and the bit lines. Persons of ordinary skill in the art will understand that memory array 10a may include more or less than 10 word lines, more or less than 10 bit lines, and more or less than 100 memory cells.

Each memory cell 12a1, 12a2, ..., 12a100 is coupled to one of the word lines and one of the bit lines, and includes a corresponding vertical transistor T1, T2, ..., T100 coupled in series with a corresponding resistivity-switching element R1, R2, ..., R100. For example, memory cell 12a1 is coupled to word line WL1 and bit line BL1, and includes a corresponding vertical transistor T1 (e.g., a field-effect transistor, as shown, or a bipolar transistor, or other similar transistor) coupled in series with a corresponding resistivity-switching element R1. Vertical transistor T1 has a controlling electrode; for example, a gate electrode for a field-effect transistor, or a base electrode for a bipolar transistor. In particular, vertical transistor T1 has a first terminal (e.g., a drain/source terminal) coupled to bit line BL1, and a second terminal (e.g., a controlling electrode, or a gate terminal) coupled to word line WL1. Resistivity-switching element R1 is coupled between a third terminal (e.g., a source/drain terminal) of vertical transistor T1 and a common potential (e.g., ground, virtual ground, or some other potential). Likewise, memory cell 12a15 includes a vertical transistor T15 that has a drain/source terminal coupled to bit line BL5, and a gate terminal coupled to word line WL2. Resistivity-switching element R15 is coupled between a source/drain terminal of vertical transistor T15 and virtual ground.

Figure 1B:
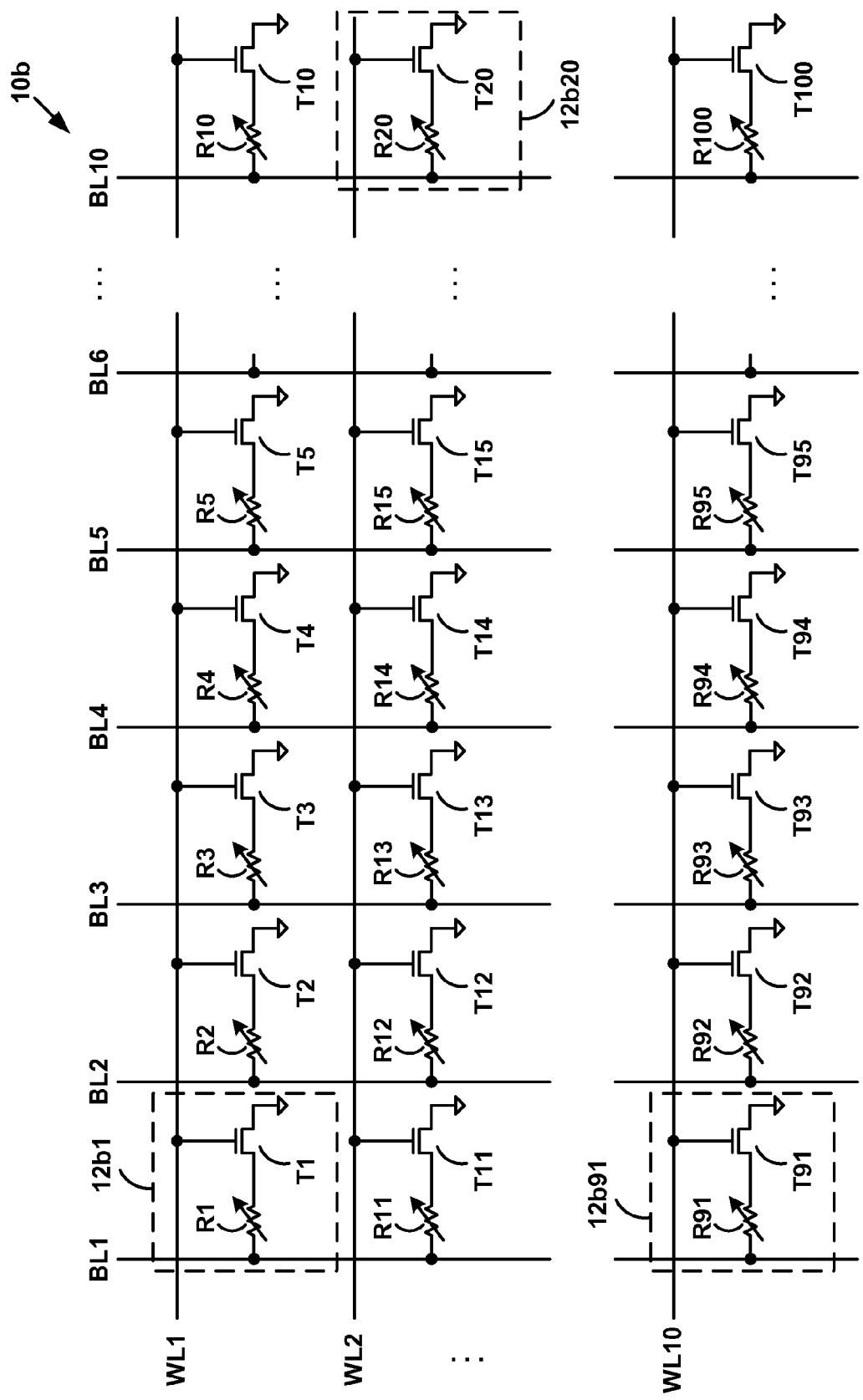

Persons of ordinary skill in the art will understand that resistivity-switching elements R1, R2, ..., R100 alternatively may be disposed between one of bit lines BL1, BL2, ..., BL10 and the drain/source terminals of corresponding vertical transistors T1, T2, ..., T100. For example, FIG. 1B is a simplified schematic diagram of an alternative example memory array 10b that includes word lines WL1, WL2, ..., WL10, bit lines BL1, BL2, ..., BL10, and memory cells 12b1, 12b2, ..., 12b100 coupled to the word lines and the bit lines. Each memory cell 12b1, 12b2, ..., 12b100 includes a resistivity-switching element R1, R2, ..., R100 coupled to a bit line, and a corresponding vertical transistor T1, T2, ..., T100 coupled to a common potential (e.g., virtual ground).

For example, memory cell 12b1 includes a resistivity-switching element R1 disposed between bit line BL1 and drain/source of corresponding vertical transistor T1, which has a gate terminal coupled to word line WL1, and a source/drain terminal coupled to virtual ground. Likewise, memory cell 12b91 includes a resistivity-switching element R91 coupled between bit line BL1 and drain/source of vertical transistor T91, which has a gate terminal coupled to word line WL10, and a source/drain terminal coupled to virtual ground.

Figure 1C:
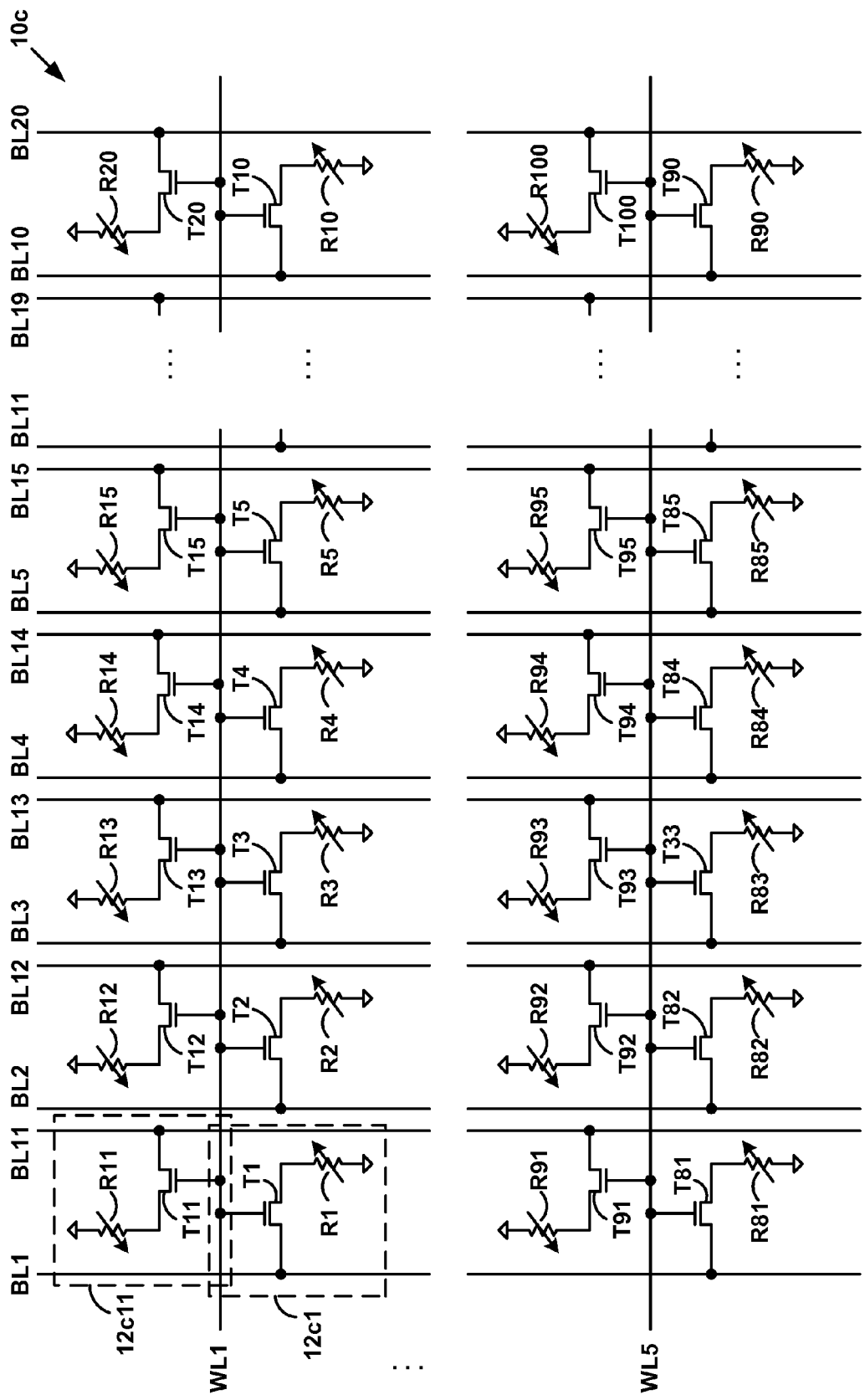

In the example embodiments of FIGS. 1A and 1B, each word line WL1, WL2, ..., WL10 is coupled on a single side to gate terminals of vertical transistors T1, T2, ..., T100. Persons of ordinary skill in the art will understand that memory arrays may be configured so that each word line may be coupled from on both sides (e.g., above and below) to gate terminals of vertical transistors T1, T2, ..., T100. For example, FIG. 1C is a simplified schematic diagram of an alternative example memory array 10c that includes word lines WL1, WL2, ..., WL5, bit lines BL1, BL2, ..., BL20, and memory cells 12c1, 12c2, ..., 12c100, coupled to the word lines and the bit lines. Memory cells 12c1, 12c2, ..., 12c100 are arranged above and below word lines WL1, WL2, ..., WL5, such that each word line is coupled from above and below to gate terminals of vertical transistors T1, T2, ..., T100.

For example, memory cell 12c1 includes a vertical transistor Ti that has a drain/source terminal coupled to bit line BL1, a source/drain terminal coupled to a first terminal of resistivity-switching element R1, which has a second terminal coupled to virtual ground, and a gate terminal coupled above to word line WL1. Likewise, memory cell 12c11 includes a vertical transistor T11 that has a drain/source terminal coupled to bit line BL11, a source/drain terminal coupled to a first terminal of resistivity-switching element R11, which has a second terminal coupled to virtual ground, and a gate terminal coupled below to word line WL1. Persons of ordinary skill in the art will understand that, although this embodiment uses half as many word lines and twice as many bit lines as the embodiments of FIGS. 1A-1B, the two sets of figures represent functionally identical circuits, with one resistivity-switching element and one transistor associated with each word line/bit line crossing Furthermore, the gate of each transistor is connected to one and only one word line, and one of the drain/source terminals of each transistor is connected to one and only one bit line.

Figure 1D:
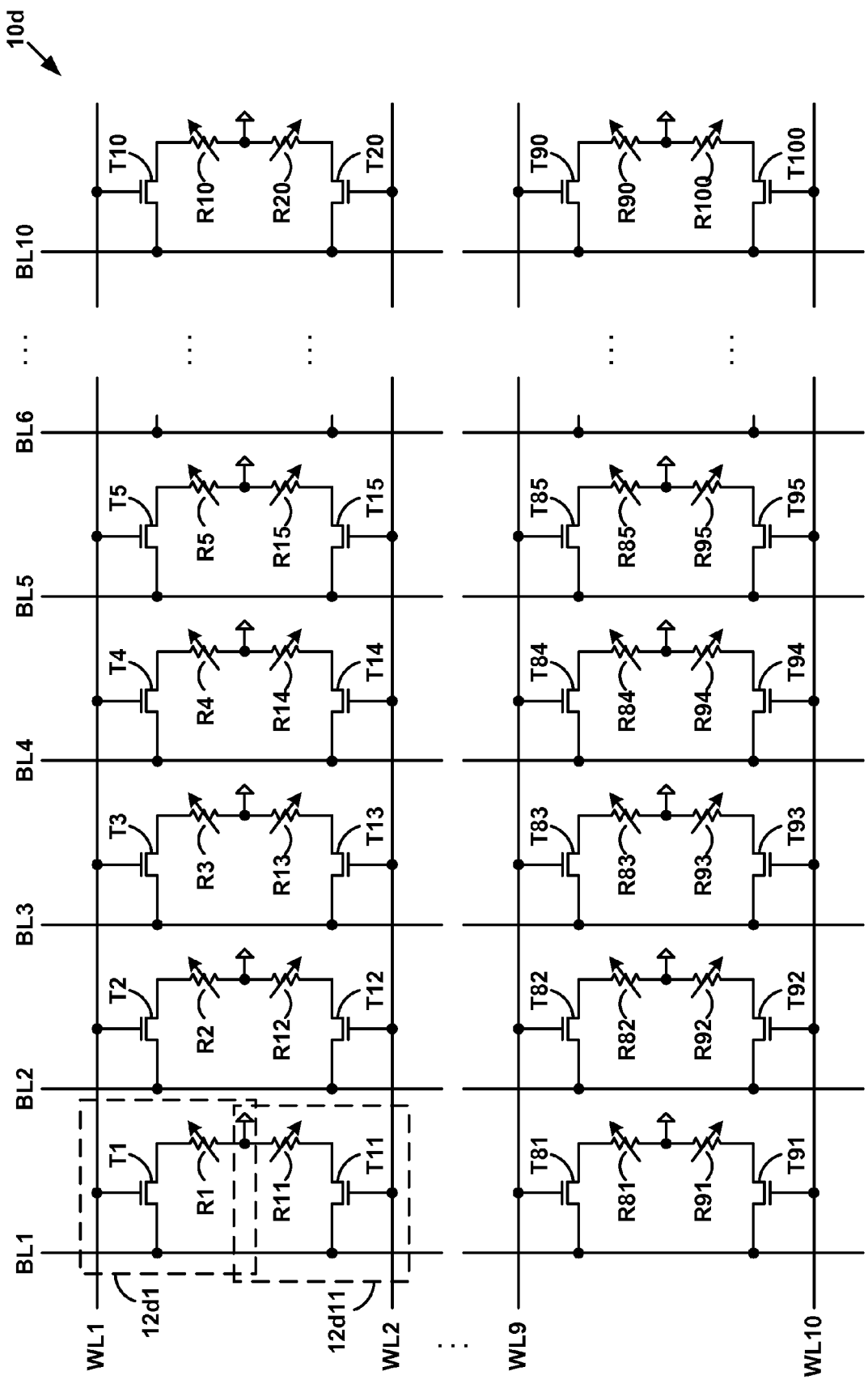

Persons of ordinary skill in the art also will understand that memory arrays may be configured such that memory cells sharing a common bit line may be interdigitated to increase bit density. For example, FIG. 1D is a simplified schematic diagram of an alternative example memory array 10c that includes word lines WL1, WL2, ..., WL10, bit lines BL1, BL2, ..., BL10, and memory cells 12d1, 12d2, ..., 12d100, coupled to the word lines and the bit lines. Each memory cell 12d1, 12d2, ..., 12d100 includes a vertical transistor coupled to a bit line, and a resistivity-switching element coupled to virtual ground.

For example, memory cell 12d1 includes a vertical transistor Ti that has a drain/source terminal coupled to bit line BL1, a gate terminal coupled to word line WL1, and a source/drain terminal coupled to a first terminal of resistivity-switching element R1, which has a second terminal coupled to virtual ground. Likewise, memory cell 12d11 includes a vertical transistor T11 that has a drain/source terminal coupled to bit line BL1, a gate terminal coupled to word line WL2, and a source/drain terminal coupled to a first terminal of resistivity-switching element R11, which has a second terminal coupled to virtual ground. As described in more detail below, memory cells sharing a common bit line in memory array 10d (e.g., memory cells 12d1 and 12d2) may be interdigitated to double the bit density compared to the bit density of memory arrays 10a-10c.

Figure 2A:
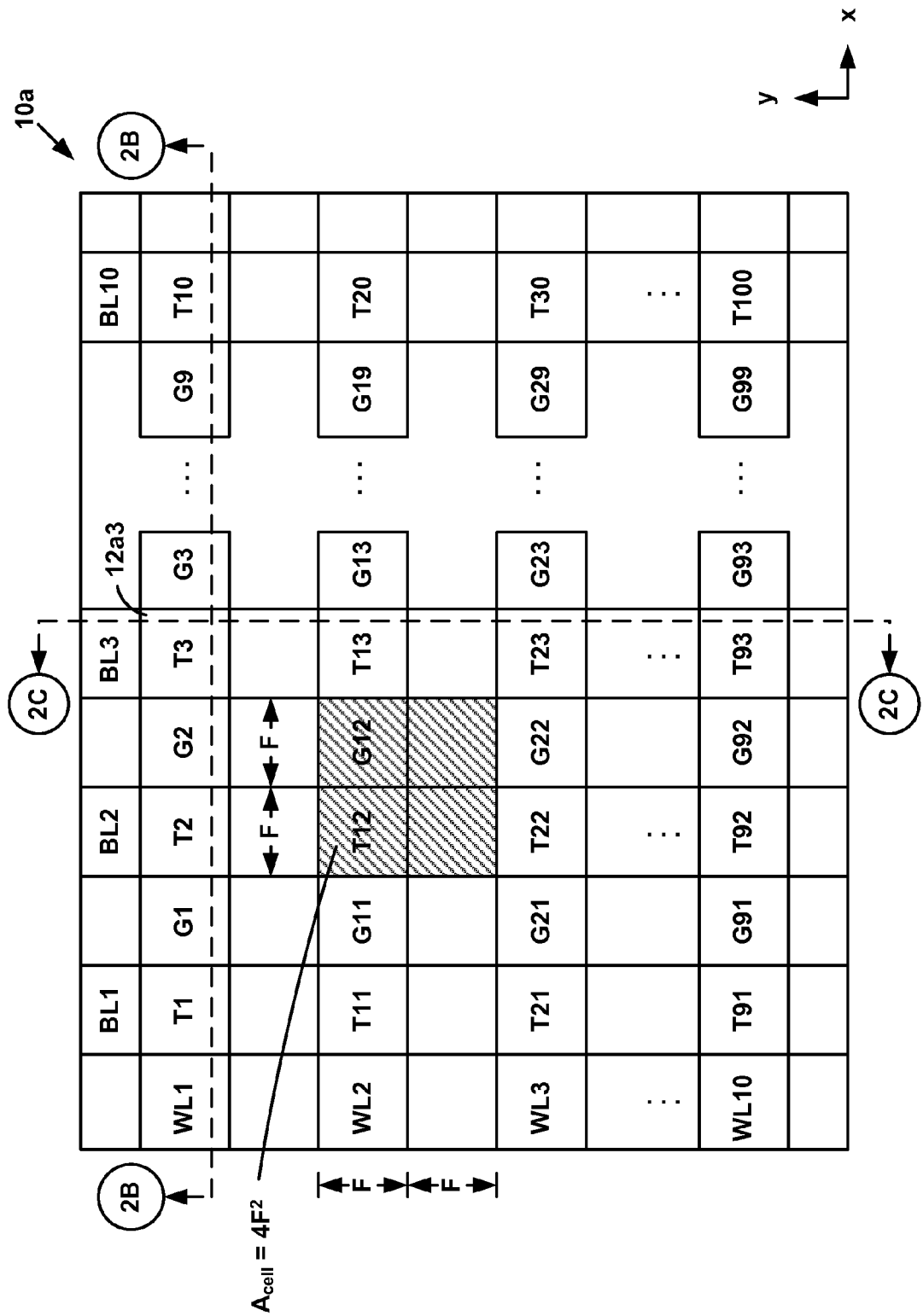
FIG. 2A is a top-level diagram of an example embodiment of the memory array of FIG. 1A.
Figure 2B:
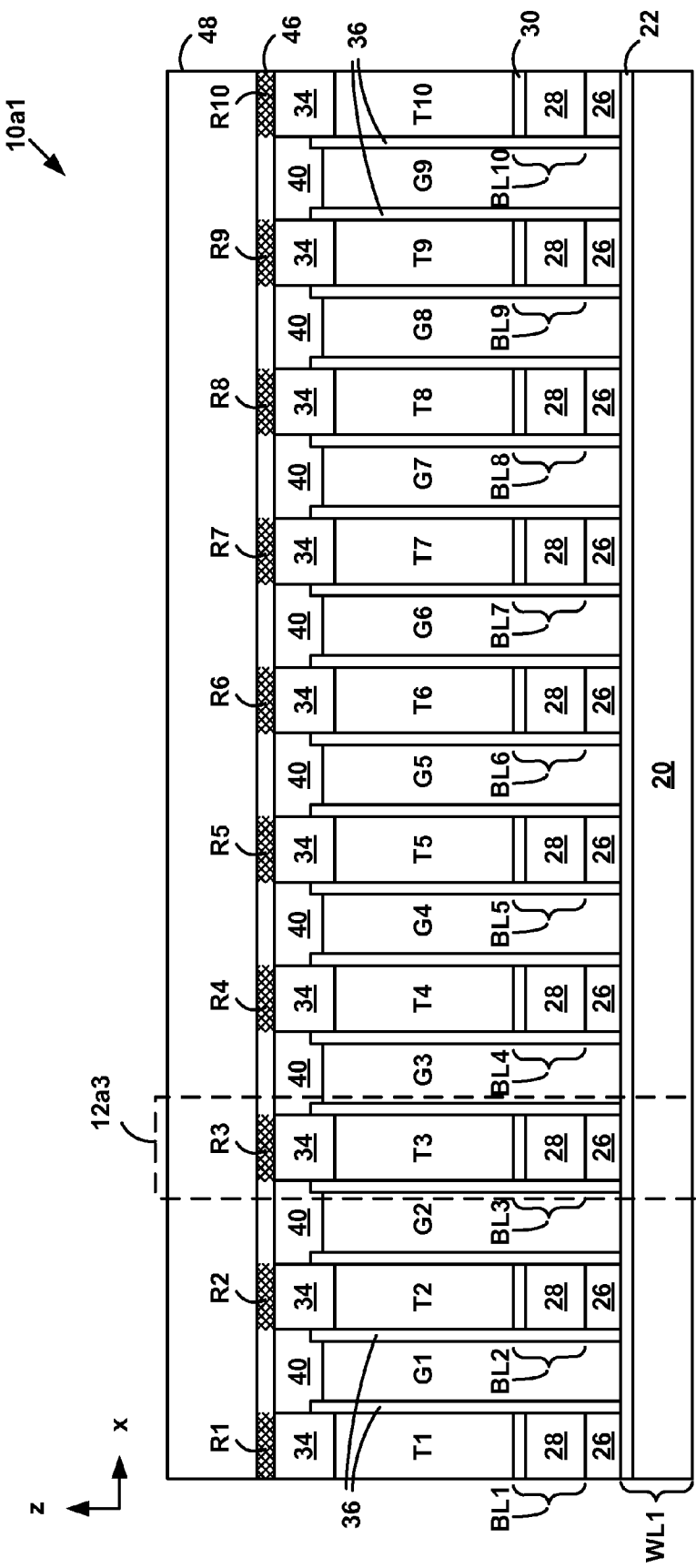
FIG. 2B is a cross-sectional view of the example embodiment of the memory array of FIG. 1A.
Figure 2C:
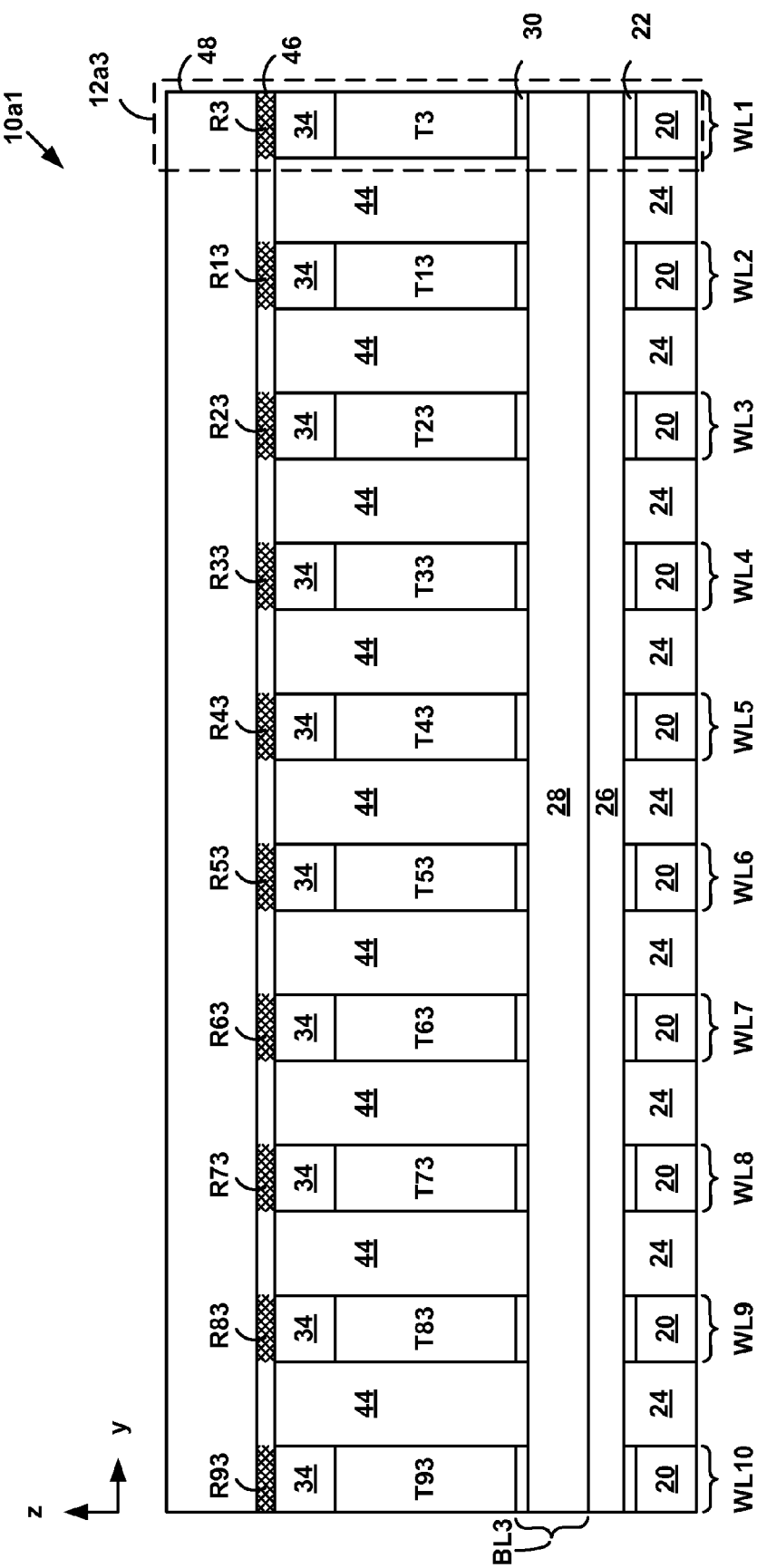
FIG. 2C is another cross-sectional view of the example embodiment of the memory array of FIG. 1A.
Figure 2E:
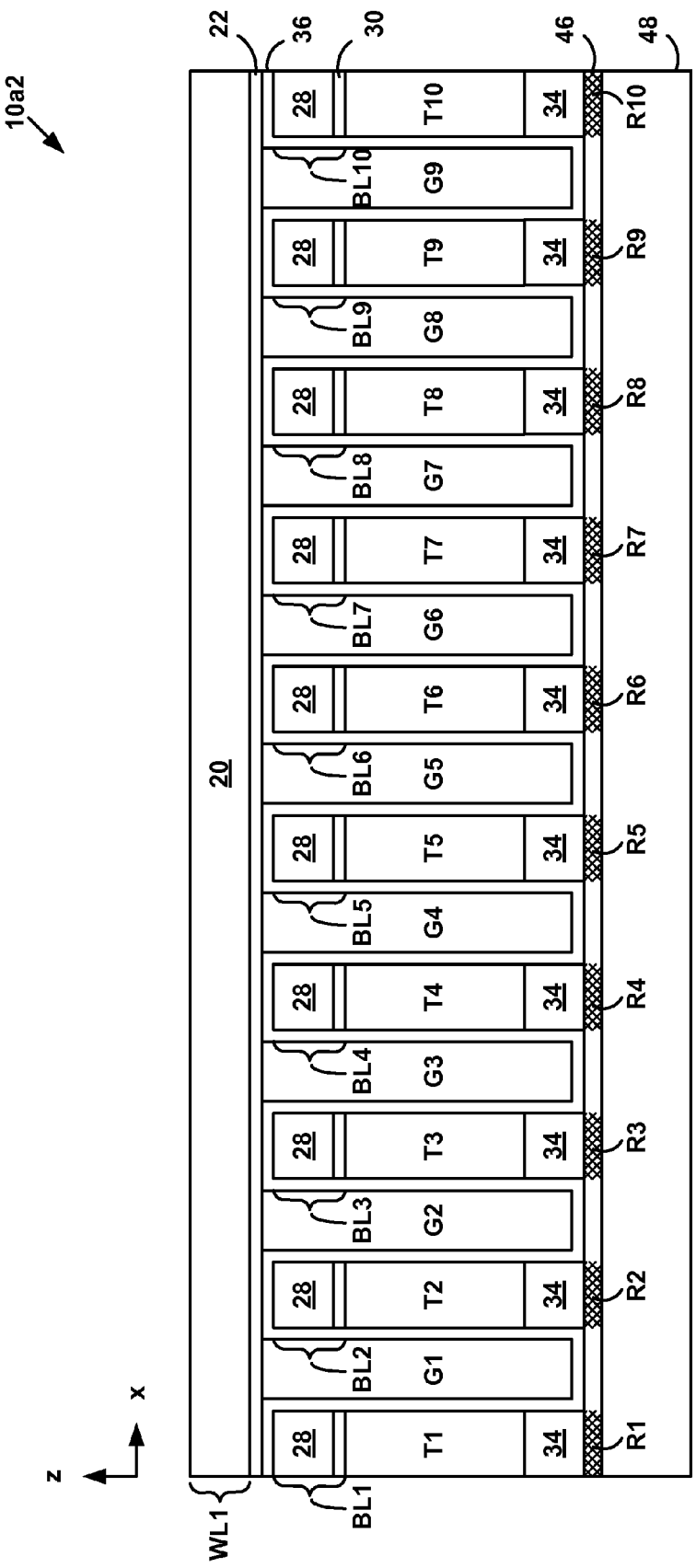
FIG. 2E is a perspective view of an alternative example embodiment of the memory array of FIG. 1A.

FIGS. 2A-2E illustrate example embodiments of memory array 10a of FIG. 1A. In particular, FIG. 2A illustrates a top view of a memory array 10a1, FIGS. 2B and 2C illustrate cross-sectional views of memory array 10a1, FIG. 2d illustrates a detailed cross-sectional view of a memory cell 12a3 of memory array 10a1, and FIG. 2E illustrate a cross-sectional view of an alternative memory array 10a2. As shown in FIG. 2A, word lines WL1, WL2, . . . , WL10 are disposed in parallel along a first axis (e.g., an x-axis), and bit lines BL1, BL2, . . . , BL10 are disposed in parallel along a second axis (e.g., a y-axis) substantially perpendicular to the first axis. A memory cell is formed at the intersection of each word line and each bit line, with each memory cell 12a1, 12a2, . . . 12a100 including a vertically-oriented pillar-shaped transistor T1, T2, . . . , T100 coupled in series with a resistivity-switching element R1, R2, . . . , R100.

For example, memory cell 12a3 is formed at the intersection of word line WL1 and bit line BL3, and includes vertical transistor T3 coupled in series with resistivity-switching element R3. Although vertical transistors T1, T2, . . . , T100 are shown as having a square cross-sectional shape, persons of ordinary skill in the art will understand that vertical transistors T1, T2, . . . , T100 may have rectangular, elliptical, or other shapes.

In example memory array 10a, each of word lines WL1, WL2, . . . , WL10 and each of bit lines BL1, BL2, . . . , BL10 has a width "F," which may be the minimum feature size of the device. Thus, each memory cell 12a1, 12a2, . . . 12a100 occupies an area $A_{cell}=4F^2$ (shown shaded in FIG. 2A). If each memory cell 12a1, 12a2, . . . 12a100 represents a single bit, the density of memory array 10a is one bit per $4F^2$ area.

Referring again to FIGS. 2A-2D, each of memory cells 12a1, 12a2, . . . 12a100 is disposed between a word line WL1, WL2, . . . , WL10 and a common source ("CS") layer 48. CS layer 48 may be tungsten, titanium nitride, or other similar conductive material or combination of conductive materials, and may be coupled to a common potential (e.g., virtual ground or other potential). Each of word lines WL1, WL2, . . . , WL10 is formed above a substrate (not shown), and includes a conductor 20, such as tungsten or other similar conductive material, and optionally may include an adhesion layer 22, such as titanium nitride or other similar adhesion layer material. A dielectric material 24, such as $SiO_2$ or other similar dielectric material is disposed between adjacent word lines. Persons of ordinary skill in the art will understand that other materials may be used for conductor 20, optional adhesion layer 22 and dielectric material 24. As described above, word lines WL1, WL2, . . . , WL10 are disposed in parallel along a first axis (e.g., an x-axis).

Bit lines BL1, BL2, . . . , BL10 are disposed above word lines WL1, WL2, . . . , WL10. In particular, bit lines BL1, BL2, . . . , BL10 are disposed in parallel along a second axis (e.g., a y-axis) generally perpendicular to the first axis. A dielectric material 26, such as $Si_3N_4$, or other similar dielectric material, is disposed between bit lines BL1, BL2, . . . , BL10 and word lines WL1, WL2, . . . , WL10. Each of bit lines BL1, BL2, . . . , BL10 includes a conductor 28, such as tungsten or other similar conductive material, and optionally may include an adhesion layer 30, such as titanium nitride or other similar adhesion layer material. Persons of ordinary skill in the art will understand that other materials may be used for conductor 28, optional adhesion layer 30 and dielectric material 26.

Vertical transistors T1, T2, . . . , T100 are disposed above bit lines BL1, BL2, . . . , BL10. Each of vertical transistors T1, T2, . . . , T100 may include a first region Ta having a first conductivity type (e.g., n+ polysilicon), a second region Tb having a second conductivity type (e.g., p polysilicon) above first region Ta, and a third region Tc having the first conductivity type (e.g., n+polysilicon) above second region Tb, such as vertical transistor T3 shown in FIG. 2D, to form drain/source, body, and source/drain regions, respectively, of a vertical FET. In some embodiments, each of vertical transistors T1, T2, . . . , T100 may have a total height (e.g., in the z-direction) of about 800 angstroms to about 4000 angstroms, although other dimensions may be used. In some embodiments, first region Ta may have a height of about 100 angstroms to about 500 angstroms, second region Tb may have a height of about 600 angstroms to about 3000 angstroms, and third region Tc may have a height of about 100 angstroms to about 500 angstroms, although other dimensions may be used. As described in more detail below, vertical transistors T1, T2, . . . , T100 may be formed by depositing semiconductor material, doping the semiconductor material to form drain/source, body, and source/drain regions, and then etching the semiconductor material to form vertical transistors T1, T2, . . . , T100.

Persons of ordinary skill in the art will understand that vertical transistors T1, T2, . . . , T100 also may be formed using layer-transfer techniques that provide a single-crystal layer. In addition, persons of ordinary skill in the art will understand that vertical transistors T1, T2, . . . , T100 alternatively may be doped p+/n/p+, or may be doped with a single type of dopant to produce a junctionless-FET. Vertical transistors T1, T2, . . . , T100 may include silicon, germanium, silicon-germanium alloys, or other similar semiconductor materials. In addition, vertical transistors T1, T2, . . . , T100 may include wide band-gap semiconductor materials, such as ZnO, InGaZnO, or SiC, which may provide a high breakdown voltage, and typically may be used to provide junctionless FETs. A conductive contact layer 34, e.g., titanium nitride or other similar adhesion layer material, optionally may be formed above each of vertical transistors T1, T2, . . . , T100.

A gate dielectric layer 36, e.g., $SiO_2$, $SiN_x$, or other similar dielectric material, is disposed on sidewalls of vertical transistors T1, T2, . . . , T100, separating gate electrodes G1, G2, . . . , G99 from adjacent vertical transistors T1, T2, . . . , T100. In some embodiments, gate dielectric layer 36 may have a thickness of about 15 angstroms to about 100 angstroms, although other thicknesses may be used. Gate electrodes G1, G2, . . . , G99 may be a metal, such as titanium nitride or other similar metal, a highly-doped semiconductor, such as n+ polysilicon, p+ polysilicon, or other similar conductive material. In some embodiments, each of gate electrodes G1, G2, . . . , G99 may have a thickness that fills the space between the vertical transistor pillars T1, T2, . . . , T100. That is, the thickness of each of the gate electrodes G1, G2, . . . G99 may be the minimum dimension F minus two times the thickness of the gate dielectric, although other thicknesses may be used.

Each of gate electrodes G1, G2, . . . , G99 is disposed on and makes conductive contact with one of word lines WL1, WL2, . . . , WL10. For example, gate electrode G3 is disposed on and makes conductive contact with WL1, gate electrode G29 is disposed and makes conductive contact with WL3, and gate electrode G91 is disposed and makes conductive contact with WL10. Dielectric cap layers 40, e.g., $SiO_2$, or other similar dielectric material, are formed on a top surface of gate electrodes G1, G2, . . . , G99.

A resistivity-switching material layer 46 is formed above conductive contact layer 34 and dielectric cap layers 40. Resistivity-switching material layer 46 may be a metal oxide, solid electrolyte, phase-change material, magnetic material, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, $MgO_x$, $CrO_2$, VO, BN, $TaO_2$, $Ta_2O_3$, and AlN. In some embodiments, resistivity-switching material layer 46 may have a thickness of about 8 angstroms to about 80 angstroms, although other thicknesses may be used. Persons of ordinary skill in the art will understand that other metal oxide materials and other resistivity-switching materials may be used. CS layer 48 is formed above resistivity-switching material layer 46.

As shown in FIGS. 2B-2D, the portions of resistivity-switching material layer 46 adjacent each vertical transistor T1, T2, ..., T100 is illustrated using cross-hatching to represent resistivity-switching elements R1, R2, ..., R100, respectively. Persons of ordinary skill in the art will understand that resistivity-switching material layer 46 may be deposited and remain as a blanket layer, such that resistivity-switching elements R1, R2, ..., R100 are not distinct elements, but instead are portions of resistivity-switching material layer 46. Alternatively, resistivity-switching material may be selectively formed as individual resistivity-switching elements R1, R2, ..., R100. For example, resistivity-switching material layer 46 may be deposited as a blanket layer and subsequently etched to form individual resistivity-switching elements R1, R2, ..., R100. Persons of ordinary skill in the art will understand that other techniques may be used to selectively form individual resistivity-switching elements R1, R2, ..., R100.

Thus, as shown in FIGS. 1A and 2A-2D, each memory cell 12a1, 12a2, ... 12a100 includes a corresponding vertical transistor T1, T2, ..., T100 that has a drain/source terminal coupled to one of bit lines BL1, BL2, ..., BL10, and a source/drain terminal coupled to a first terminal of a corresponding resistivity-switching element R1, R2, ..., R100, which has a second terminal coupled to CS layer 48. Note in FIG. 2B that vertical transistors T2, T3, ..., T9 have gate terminals disposed on opposite sides of each vertical transistor pillar. For example, vertical transistor T2 has gate terminals G1 and G2, vertical transistor T3 has gate terminals G2 and G3, and so on. For each vertical transistor T1, T2, ... T100, both sidewall gate terminals are connected to the same word line, and thus are connected to the same electrical node. For example, transistor pillar T13 has gate electrodes G12 and G13 disposed on its opposite sidewalls, but both gate electrodes G12 and G13 are connected to word line WL2, and thus form one electrical gate for the transistor. In this regard, vertical transistors T2 and T3 share gate terminal G3, vertical transistors T3 and T4 share gate terminal G4, and so on. Again, these shared gate terminals G3, G4 are connected to a single word line WL1.

In the embodiments of FIGS. 2B-2D, bit lines BL1, BL2, ..., BL10, vertical transistors T1, T2, ..., T100, and resistivity-switching elements R1, R2, ..., R100 are disposed above word lines WL1, WL2, ..., WL10. Persons of ordinary skill in the art will understand that the structure of FIGS. 2B-2D may be inverted. For example, FIG. 2E illustrates a cross-sectional view of an alternative memory array 10a2 which includes word lines WL1, WL2, ..., WL10 disposed above bit lines BL1, BL2, ..., BL10, vertical transistors T1, T2, ..., T100, and resistivity-switching elements R1, R2, ..., R100.

In particular, resistivity-switching material layer 46 is disposed above CS layer 48. Vertical transistors T1, T2, ..., T100 are disposed above resistivity-switching material layer 46, and conductive contact layer 34 optionally is disposed between vertical transistors T1, T2, ..., T10 and resistivity-switching material layer 46. Bit lines BL1, BL2, ..., BL10 are disposed above vertical transistors T1, T2, ..., T100. Gate dielectric layer 36, e.g., $SiO_2$, $SiN_x$, or other similar dielectric material, is disposed on sidewalls of vertical transistors T1, T2, ..., T100, separating gate electrodes G1, G2, ..., G99 from adjacent vertical transistors T1, T2, ..., T100. Gate dielectric layer 36 also is disposed on top of and on sidewalls of bit lines BL1, BL2, ..., BL10. Word lines WL1, WL2, ..., WL10 are formed above gate electrodes G1, G2, ..., G99 and top surfaces of gate dielectric layer 36. Word lines WL1, WL2, ..., WL10 make conductive contact with gate electrodes G1, G2, ..., G99.

Thus, as shown in FIGS. 1A and 2E, each memory cell 12a1, 12a2, ... 12a100 includes a corresponding vertical transistor T1, T2, ..., T100 that has a drain/source terminal coupled to one of bit lines BL1, BL2, ..., BL10, a corresponding gate terminal G1, G2, ..., G100 coupled to one of word lines WL1, WL2, ..., WL10, and a source/drain terminal coupled to a first terminal of a corresponding resistivity-switching element R1, R2, ..., R100, which has a second terminal coupled to CS layer 48.

Figure 3A:
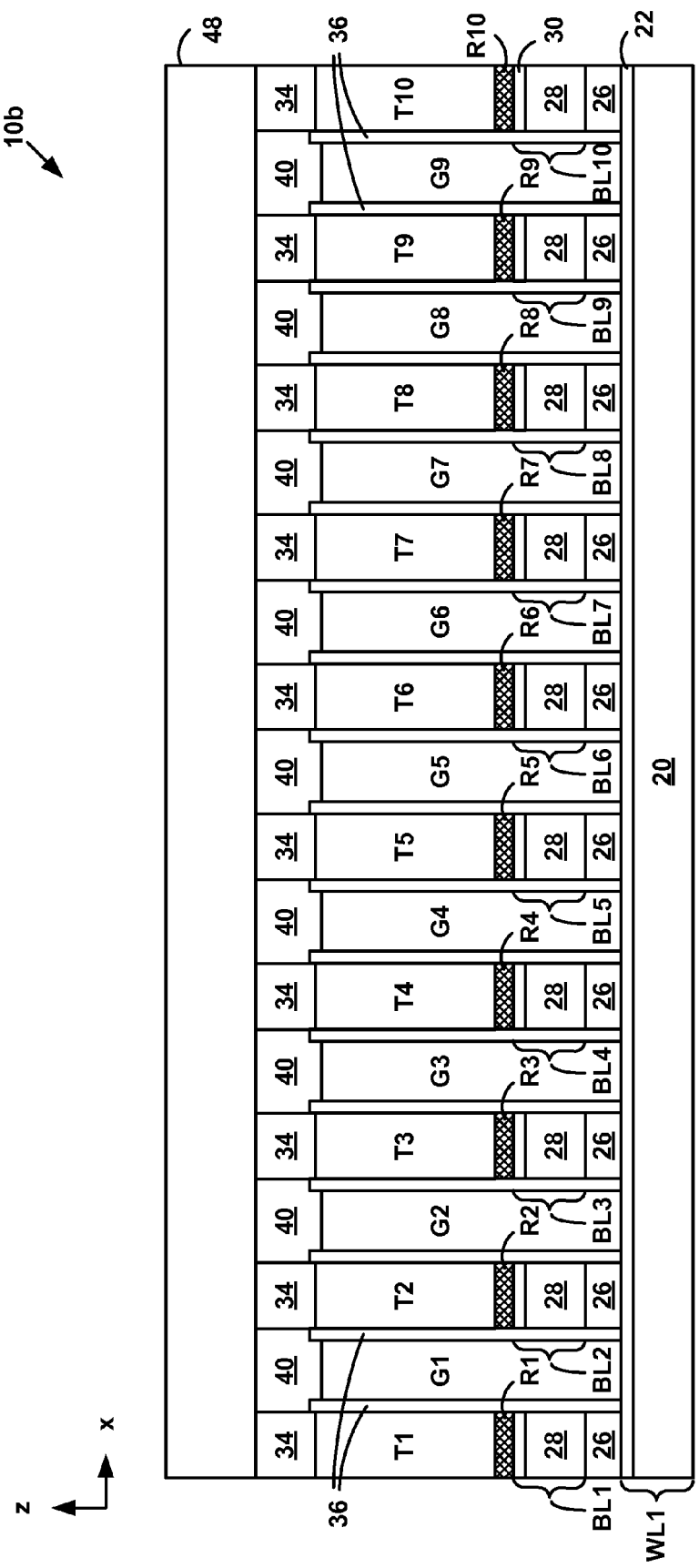
FIG. 3A is a perspective view of an example embodiment of the memory array of FIG. 1B.

As described above and as illustrated in FIG. 1B, resistivity-switching elements R1, R2, ..., R100 alternatively may be disposed between one of bit lines BL1, BL2, ..., BL10 and the drain/source terminals of corresponding vertical transistors T1, T2, ..., T100. FIG. 3A illustrates a cross-sectional view of an example embodiment of memory array 10b of FIG. 1B. Memory array 10b of FIG. 3A is similar to memory array 10a1 of FIG. 2B, except that resistivity-switching elements R1, R2, ..., R100 are formed above bit lines BL1, BL2, ..., BL10. For example, resistivity-switching material layer 46 may be deposited above bit lines BL1, BL2, ..., BL10, semiconductor material may be deposited above resistivity-switching material layer 46 and then doped to form drain/source, body, and source/drain regions, and then the semiconductor material and resistivity-switching material layer 46 may be etched to form vertical transistors T1, T2, ..., T100 coupled to corresponding resistivity-switching elements R1, R2, ..., R100.

Figure 3B:
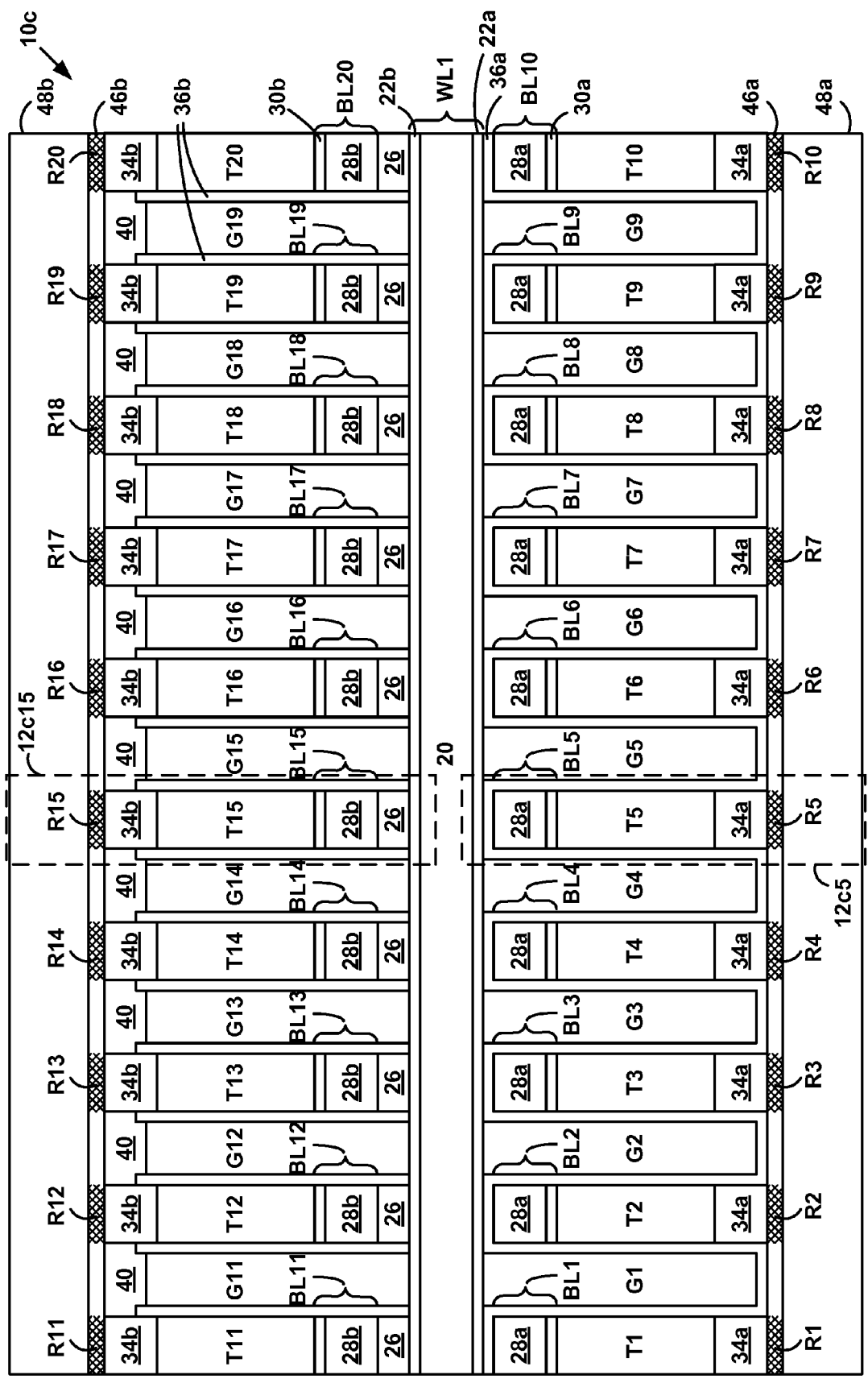
FIG. 3B is a perspective view of an example embodiment of the memory array of FIG. 1C.
Figure 41I:
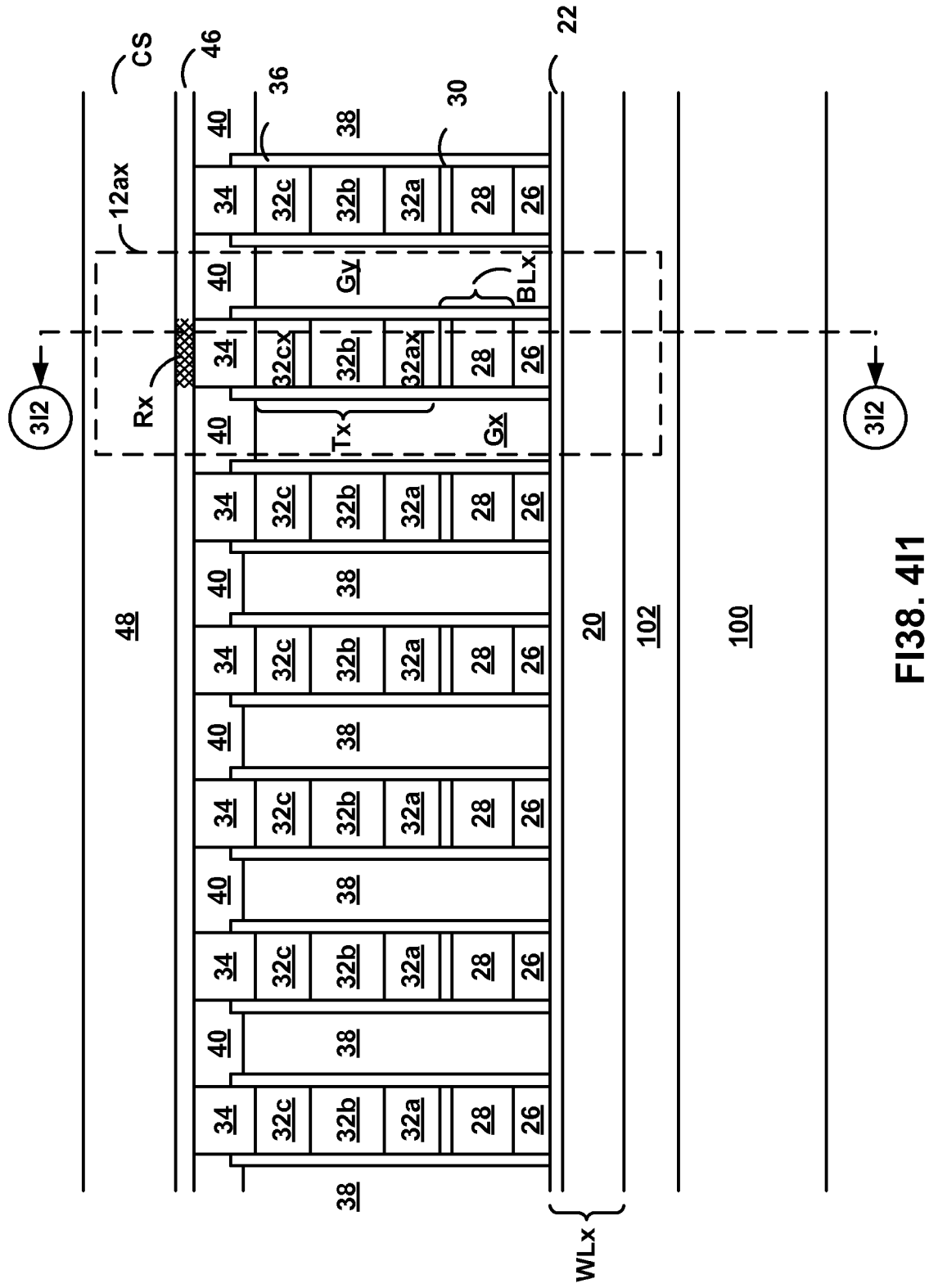

As described above and illustrated in FIGS. 2B and 2E, memory arrays may be formed with word lines WL1, WL2, ..., WL10 above or below bit lines BL1, BL2, ..., BL10. These two structures may be combined, such that one set of word lines WL1, WL2, ..., WL10 may be connected to gates above and below each word line, such as described above in FIG. 1C, in which memory array 10c includes memory cells 12c1, 12c2, ..., 12c100 arranged above and below word lines WL1, WL2, ..., WL5. FIG. 3B illustrates a cross-sectional view of an example embodiment of memory array 10c of FIG. 1C.

In particular, a first resistivity-switching material layer 46a is disposed above a first CS layer 48a. Vertical transistors T1, T2, ..., T10 are disposed above first resistivity-switching material layer 46a, and conductive contact layer 34a optionally are disposed between vertical transistors T1, T2, ..., T10 and first resistivity-switching material layer 46a. Bit lines BL1, BL2, ..., BL10 are disposed above vertical transistors T1, T2, ..., T10. Each of bit lines BL1, BL2, ..., BL10 includes a conductor 28a, such as tungsten or other similar conductive material, and optionally may include an adhesion layer 30a, such as titanium nitride or other similar adhesion layer material.

A gate dielectric layer 36a, e.g., $SiO_2$, $SiN_x$, or other similar dielectric material, is disposed on sidewalls of vertical transistors T1, T2, ..., T10, separating gate electrodes G1, G2, ..., G9 from adjacent vertical transistors T1, T2, ..., T10. Gate dielectric layer 36a also is disposed on top of and on sidewalls of bit lines BL1, BL2, ..., BL10. Word line WL1, which includes conductor 20 and optionally may include a first adhesion layer 22a (e.g., titanium nitride or other similar adhesion layer material) and a second adhesion layer 22b (e.g., titanium nitride or other similar adhesion layer material), is formed above gate electrodes G1, G2, ..., G9 and top surfaces of gate dielectric layer 36a.

Bit lines BL11, BL12, ..., BL20 are disposed above word line WL1. Dielectric material 26 is disposed between bit lines BL11, BL12, ..., BL20 and word line WL1. Each of bit lines BL11, BL12, ..., BL20 includes a conductor 28$b$, such as tungsten or other similar conductive material, and optionally may include an adhesion layer 30$b$, such as titanium nitride or other similar adhesion layer material. Vertical transistors T11, T12, ..., T20 are disposed above bit lines BL11, BL12, ..., BL20.

Gate dielectric layer 36$b$, e.g., $SiO_2$, $SiN_x$, or other similar dielectric material, is disposed on sidewalls of vertical transistors T11, T12, ..., T20, separating gate electrodes G11, G12, ..., G19 from adjacent vertical transistors T11, T12, ..., T20. Each of gate electrodes G11, G12, ..., G19 is disposed on and makes conductive contact with word line WL1. Dielectric cap layers 40 are formed on a top surface of gate electrodes G11, G12, ..., G19. A second resistivity-switching material layer 46$b$ is formed above conductive contact layer 34$b$ and dielectric cap layers 40. A second CS layer 48$b$ is formed above second resistivity-switching material layer 46$b$.

Thus, for example, memory cell 12$c$5 includes a vertical transistor T5 that has a drain/source terminal coupled to bit line BL5, a source/drain terminal coupled to a first terminal of resistivity-switching element R1, which has a second terminal coupled to second CS layer 48$b$, and gate terminals G14 and G15 coupled below to word line WL1. Likewise, memory cell 12$c$5 includes a vertical transistor T5 that has a drain/source terminal coupled to bit line BL5, a source/drain terminal coupled to a first terminal of resistivity-switching element R11, which has a second terminal coupled to first CS layer 48$a$, and gate terminals G4 and G5 coupled above to word line WL1.

Referring now to FIGS. 4A1-4I2, an example method of forming a memory array is described. In particular, FIGS. 4A1-4I2 illustrate an example method of forming a single row of a memory array, such as memory array 10$a$1 of FIG. 2B. With reference to FIGS. 4A1-4A2, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown). Isolation layer 102 is formed above substrate 100. In some embodiments, isolation layer 102 may be a layer of silicon dioxide, silicon nitride, silicon oxynitride or any other suitable insulating layer.

Following formation of isolation layer 102, a conductive layer 20 is deposited over isolation layer 102. Conductive layer 20 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 20 may comprise between about 200 and about 2500 angstroms of tungsten. Other conductive layer materials and/or thicknesses may be used. In some embodiments, an adhesion layer (not shown), such as titanium nitride or other similar adhesion layer material, may be disposed between isolation layer 102 and conductive layer 20.

Following formation of conductive layer 20, an adhesion layer 22 is formed over conductive layer 20 (e.g., by PVD or another method). For example, adhesion layer 22 may be between about 20 and about 500 angstroms, and preferably about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed. In some embodiments, adhesion layer 22 may be optional.

Following formation of adhesion layer 22, adhesion layer 22 and conductive layer 20 are patterned and etched. For example, adhesion layer 22 and conductive layer 20 may be patterned and etched using conventional lithography techniques, with a soft or hard mask, and wet or dry etch processing. In at least one embodiment, adhesion layer 22 and conductive layer 20 are patterned and etched to form substantially parallel, substantially co-planar word lines WL. Example widths for word lines WL and/or spacings between word lines WL range between about 100 and about 2500 angstroms, although other conductor widths and/or spacings may be used.

After word lines WL have been formed, a dielectric material layer 24 is formed over substrate 100 to fill the voids between word lines WL. For example, approximately 3000-7000 angstroms of silicon dioxide may be deposited on the substrate 100 and planarized using chemical mechanical polishing or an etchback process to form a planar surface 104. Planar surface 104 includes exposed top surfaces of word lines WL separated by dielectric material 24. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, word lines WL may be formed using a damascene process in which dielectric material layer 24 is formed, patterned and etched to create openings or voids for word lines WL. The openings or voids then may be filled with conductive layer 20 and adhesion layer 22 (and/or a conductive seed, conductive fill and/or barrier layer if needed). Adhesion layer 22 and conductive layer 20 then may be planarized to form planar surface 104. In such an embodiment, conductive layer 20 will line the bottom and sidewalls of each opening or void.

Following planarization, bit lines and vertical transistors of each memory cell are formed. With reference to FIGS. 4B1-4B2, a dielectric material layer 26 is formed over substrate 100. For example, approximately 200 to 1500 angstroms of $Si_3N_4$, may be deposited on the substrate 100. Other dielectric materials such as silicon oxynitride, low K dielectrics, etc., and/or other dielectric material layer thicknesses may be used. Example low K dielectrics include carbon doped oxides, silicon carbon layers, or the like.

After deposition of dielectric material layer 26, a conductive layer 28 is deposited over dielectric material layer 26. Conductive layer 28 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 28 may comprise between about 200 and about 2500 angstroms of tungsten. An optional conductive adhesion layer (not shown), such as titanium nitride, tantalum nitride, or other conductive material may be deposited prior to the Tungsten deposition. This adhesion layer may be, for example, between 20 and 250 Angstroms thick. Other conductive layer materials and/or thicknesses may be used.

Following formation of conductive layer 28, an adhesion layer 30 is formed over conductive layer 28 (e.g., by PVD or another method). For example, adhesion layer 30 may be between about 20 and about 500 angstroms of titanium nitride or another suitable adhesion layer such as tantalum nitride, tungsten nitride, tungsten, molybdenum, combinations of one or more adhesion layers, or the like. Other adhesion layer materials and/or thicknesses may be employed. In some embodiments, adhesion layer 30 may be optional.

Following formation of adhesion layer 30, deposition of the semiconductor material 32 used to form the vertical transistor of each memory cell begins. In some embodiments, each vertical transistor is formed from a polycrystalline semiconductor material such as polysilicon, a polycrystalline silicon-germanium alloy, polygermanium or any other suitable material. Alternatively, the vertical transistors may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each vertical transistor may include a first region (e.g., n+ polysilicon), a second region (e.g., p polysilicon) and a third region (e.g., n+polysilicon) to form drain/source, body, and source/drain regions, respectively, of a vertical FET. For example, following formation of adhesion layer 30, a heavily doped n+ silicon layer 32a may be deposited on adhesion layer 30. In some embodiments, n+ silicon layer 32a is in an amorphous state as deposited. In other embodiments, n+ silicon layer 32a is in a polycrystalline state as deposited. CVD or another suitable process may be employed to deposit n+ silicon layer 32a.

In at least one embodiment, n+ silicon layer 32a may be formed, for example, from about 100 to about 500 angstroms, of phosphorus or arsenic doped silicon having a doping concentration of about $10^{21}$ cm$^{-3}$. Other layer thicknesses, doping types and/or doping concentrations may be used. N+ silicon layer 32a may be doped in situ, for example, by flowing a donor gas during deposition. Other doping methods may be used (e.g., implantation).

After deposition of n+ silicon layer 32a, a doped p-type silicon layer 32b may be formed over n+ silicon layer 32a. P-type silicon may be either deposited and doped by ion implantation or may be doped in situ during deposition to form a p-type silicon layer 32b. For example, an intrinsic silicon layer may be deposited on n+ silicon layer 32a, and a blanket p-type implant may be employed to implant boron a predetermined depth within the intrinsic silicon layer. Example implantable molecular ions include $BF_2$, $BF_3$, B and the like. In some embodiments, an implant dose of about $1-10\times10^{13}$ ions/cm$^2$ may be employed. Other implant species and/or doses may be used. Further, in some embodiments, a diffusion process may be employed. In at least one embodiment, the resultant p-type silicon layer 32b has a thickness of from about 800 to about 4000 angstroms, although other p-type silicon layer sizes may be used.

Following formation of p-type silicon layer 32b, a heavily doped n+ silicon layer 32c is deposited on p-type silicon layer 32b. In some embodiments, n+ silicon layer 32c is in an amorphous state as deposited. In other embodiments, n+ silicon layer 32c is in a polycrystalline state as deposited. CVD or another suitable process may be employed to deposit n+ silicon layer 32c.

In at least one embodiment, n+ silicon layer 32c may be formed, for example, from about 100 to about 500 angstroms of phosphorus or arsenic doped silicon having a doping concentration of about $10^{21}$ cm$^{-3}$. Other layer thicknesses, doping types and/or doping concentrations may be used. N+ silicon layer 32c may be doped in situ, for example, by flowing a donor gas during deposition. Other doping methods may be used (e.g., implantation). Persons of ordinary skill in the art will understand that silicon layers 32a, 32b and 32c alternatively may be doped p+/n/p+, respectively, or may be doped with a single type of dopant to produce junctionless-FETs.

After deposition of p+ silicon layer 32b, a conductive contact layer 34 may be formed over p+ silicon layer 32b (e.g., by PVD or another method). For example, conductive contact layer 34 may be between about 30 to about 600 angstroms of titanium nitride or another suitable adhesion layer such as tantalum nitride, tungsten nitride, tungsten, molybdenum, combinations of one or more adhesion layers, or the like. Other adhesion layer materials and/or thicknesses may be employed. In some embodiments, conductive contact layer 34 may be optional.

Conductive contact layer 34, semiconductor layers 32c, 32b and 32a, adhesion layer 30, conductive layer 28 and adhesion layer 26 are patterned and etched to form etched rows 50, resulting in the structure shown in FIGS. 4C1-4C2. In at least one embodiment, conductive contact layer 34, semiconductor layers 32c, 32b and 32a, adhesion layer 30, conductive layer 28 and adhesion layer 26 are patterned and etched to form substantially parallel, substantially co-planar bit lines BL. Example widths for bit lines BL and/or spacings between bit lines BL range between about 100 and about 2500 angstroms, although other conductor widths and/or spacings may be used.

The memory cell layers may be patterned and etched in a single pattern/etch procedure or using separate pattern/etch steps. For example, photoresist may be deposited, patterned using standard photolithography techniques, layers 34, 32c-32a, 30, 28 and 26 may be etched, and then the photoresist may be removed. Alternatively, a hard mask of some other material, for example silicon dioxide, may be formed on top of conductive contact layer 34, with bottom antireflective coating ("BARC") on top, then patterned and etched. Similarly, dielectric antireflective coating ("DARC") and/or amorphous carbon film (e.g., the Advanced Patterning Film from Applied Materials, Santa Clara, Calif.) may be used as a hard mask.

Any suitable masking and etching process may be used to form etched rows 50. For example, layers 34, 32c-32a, 30, 28 and 26 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, rows 50 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A gate dielectric layer 36 is deposited conformally over rows 50 to fill the voids between rows 50. For example, between about 15 to about 100 angstroms of silicon dioxide may be deposited, resulting in the structure illustrated in FIGS. 4D1-4D2. Other dielectric materials such as silicon nitride, silicon oxynitride, low K dielectrics, etc., and/or other dielectric material layer thicknesses may be used.

An anisotropic etch is used to remove lateral portions of gate dielectric layer 36, leaving only sidewall portions of gate dielectric layer 36 on the sides of rows 50, resulting in the structure shown in FIGS. 4E1-4E2. For example, a sputter etch or other suitable process may be used to anisotropically etch gate dielectric layer 36. To clear gate dielectric layer 36 from the bottom of the trenches, gate dielectric layer 36 typically may be over-etched somewhat to compensate for variations across a wafer. This may cause the top of the dielectric to recess below the top of conductive contact layer 34, as shown in FIG. 4E1.

Gate electrode material 38 is deposited over rows 50 to fill the voids between rows 50. For example, approximately 100 to 2000 angstroms of such as titanium nitride or other similar metal, a highly-doped semiconductor, such as n+ polysilicon, p+ polysilicon, or other similar conductive material may be deposited. The as-deposited gate electrode material 38 is subsequently etched back to expose the top of conductive contact layer 34. The gate material 38 is further etched to recess the gate electrodes below the top surface of conductive layer 34. The gate material 38 may be recessed between 100 and 500 Angstroms from the top of the conductive layer 34. Dry etching, chemical-mechanical polishing, or a combination of the two may be used to planarize and recess gate material 38. A dielectric material layer 40 is deposited over the recessed gate electrode material 38. For example, approximately 100 to 800 angstroms of silicon dioxide may be deposited and planarized using chemical mechanical polishing or an etch-back process to form a planar surface 106, resulting in the structure illustrated in FIGS. 4F1-4F2.

A hard mask layer 42 is formed over substrate 100. For example, approximately 100 to 3000 angstroms of amorphous carbon, amorphous silicon, silicon dioxide, silicon nitride, or other similar hard mask material may be deposited on the substrate 100, such as by CVD, PVD, or other similar technique. Hard mask layer 42 may be a single material or a stack of different materials. Other hard mask layer thicknesses may be used.

Hard mask layer 42, dielectric material layer 40, gate electrode material 38, gate dielectric layer 36, conductive contact layer 34, semiconductor layers 32c, 32b and 32a, and adhesion layer 30 are patterned using the word line pattern and anisotropically etched to form etched pillars 52, resulting in the structure shown in FIGS. 4G1-4G2. Layers 42, 40, 38, 36, 34, 32c, 32b, 32a and 30 may be patterned and etched in a single pattern/etch procedure or using separate pattern/etch steps. For example, gate electrode material 38 may be etched first, followed by the semiconductor layers 32c, 32b and 32a. The etch should be selective to conductive layer 28 at the bottom of the vertical transistor stack, so that the bit lines are not etched. This etch finishes forming the vertical FET body pillars and the gate pillars.

In some embodiments, after etching, pillars 52 may be cleaned using a dilute hydrofluoric/sulfuric acid clean. Such cleaning may be performed in any suitable cleaning tool, such as a Raider tool. Example post-etch cleaning may include using ultra-dilute sulfuric acid (e.g., about 1.5 1.8 wt %) for about 60 seconds and/or ultra-dilute HF acid (e.g., about 0.4-0.6 wt %) for 60 seconds. Megasonics may or may not be used. Other clean chemistries, times and/or techniques may be employed.

Remaining hard mask layer 42 is removed, and a dielectric material layer 44 is deposited over pillars 52 to fill the voids between pillars 52. For example, approximately 2000-7000 angstroms of silicon dioxide may be deposited and planarized using chemical mechanical polishing or an etch-back process to form a planar surface 108, resulting in the structure illustrated in FIGS. 4H1-4H2. Planar surface 108 includes exposed top surfaces of pillars 52 separated by dielectric material 44 (as shown). Other dielectric materials such as silicon nitride, silicon oxynitride, low K dielectrics, etc., and/or other dielectric material layer thicknesses may be used.

At this point, an annealing process may optionally be performed to increase the current driving capability of the vertical transistor. Such an annealing process may include a rapid thermal anneal at temperatures between about 650 C and 850 C, for times between about 10 seconds and 120 seconds. Alternatively, the annealing process may include a furnace anneal at temperatures between about 575 C and 650 C, for times between about 2 hours and 24 hours. The anneal process may include a laser anneal, where a laser is used to heat the transistor material 32a-c for between about 10 to 100 milliseconds, or the laser is used to melt the transistor material 32a-c, afterwards allowing it to cool and recrystallize. A combination of any or all of these annealing methods may be used. The annealing process may be performed at any time after the transistor material 32a-c is deposited, and before the resistivity-switching material is deposited.

Following planarization and optional annealing, a resistivity-switching material layer 46 is deposited over planar surface 108. Resistivity-switching material layer 46 may be a metal oxide, solid electrolyte, phase-change material, magnetic material, or other similar resistivity-switching material. Various metal oxides can be used, such as transition metal-oxides. Examples of metal-oxides include, but are not limited to, $NiO$, $Nb_2O_5$, $TiO_2$, $HfO_2$, $Al_2O_3$, $MgO_x$, $CrO_2$, $VO$, $BN$, $TaO_2$, $Ta_2O_3$, and $AlN$. Resistivity-switching material layer 46 may be deposited by any suitable method (e.g., CVD, PVD, etc.). In at least one embodiment, resistivity-switching material layer 46 may be between about 8 and about 80 angstroms of $HfO_2$. Persons of ordinary skill in the art will understand that other metal oxide materials, other resistivity-switching materials, thicknesses and other deposition techniques may be used.

CS layer 48 is next deposited over resistivity-switching material layer 46, resulting in the structure shown in FIGS. 4I1-4I2. CS layer 48 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, CS layer 48 may comprise between about 200 and about 5000 angstroms of tungsten. Other conductive layer materials and/or thicknesses may be used.

Thus, the resulting structure in FIGS. 4I1-4I2 includes multiple memory cells (e.g., memory cell 12ax), with each memory cell coupled to one of the word lines (e.g., WLx) and one of the bit lines (e.g., BLx), and includes a corresponding vertical transistor (e.g., Tx) coupled in series with a corresponding resistivity-switching element (e.g., Rx). In particular, vertical transistor Tx has a drain/source terminal 32ax coupled to bit line BLx, and a gate terminal Gx/Gy coupled to word line WLx. Resistivity-switching element Rx is coupled between a source/drain terminal 32cx of transistor Tx and a CS layer 48. The example process of FIGS. 4A1-4I2 uses three masking steps to form a layer of memory cells.

Figure 5A:
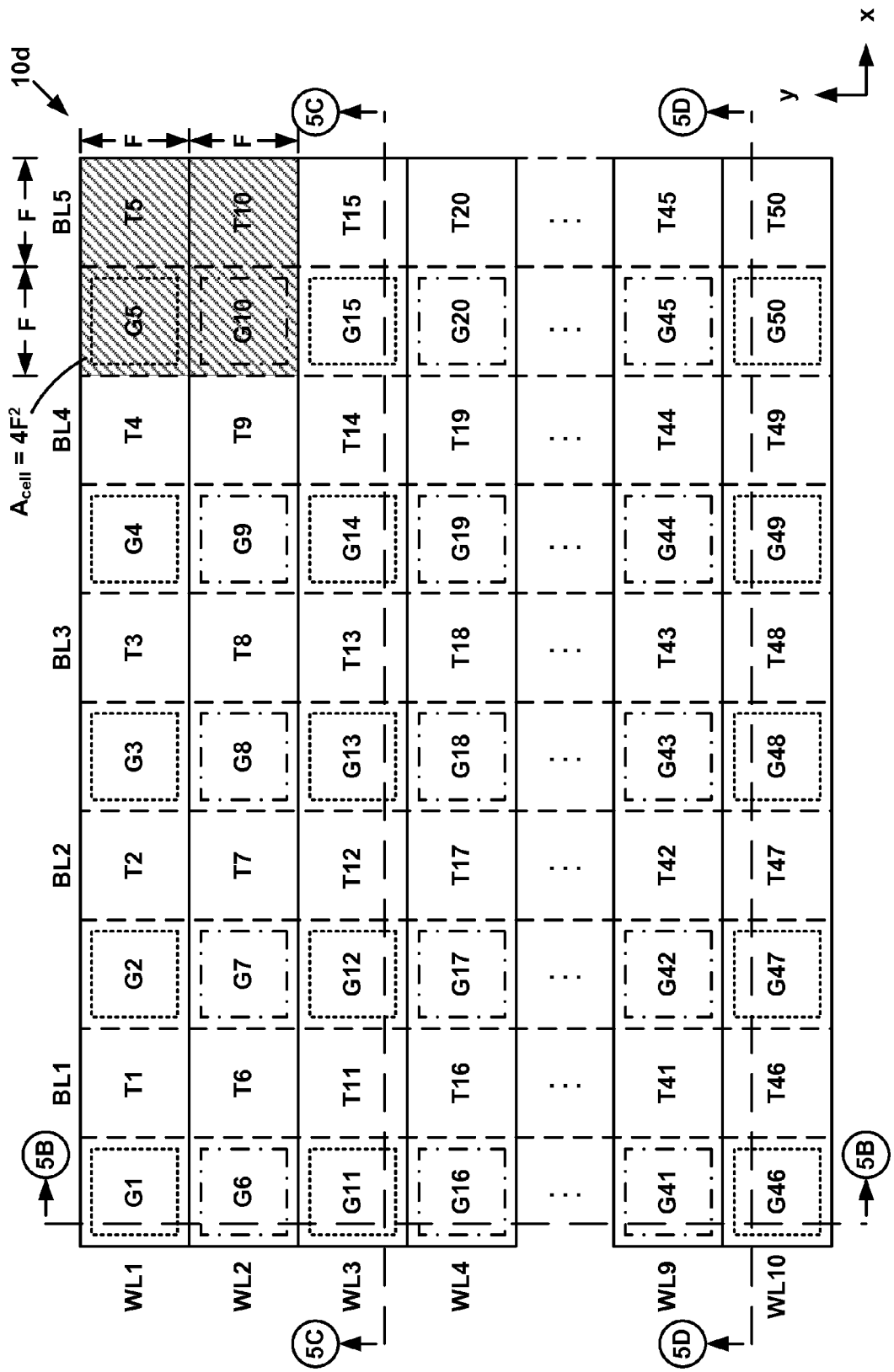
FIG. 5A is a top-level diagram of an example embodiment of the memory array of FIG. 1D.
Figure 5B:
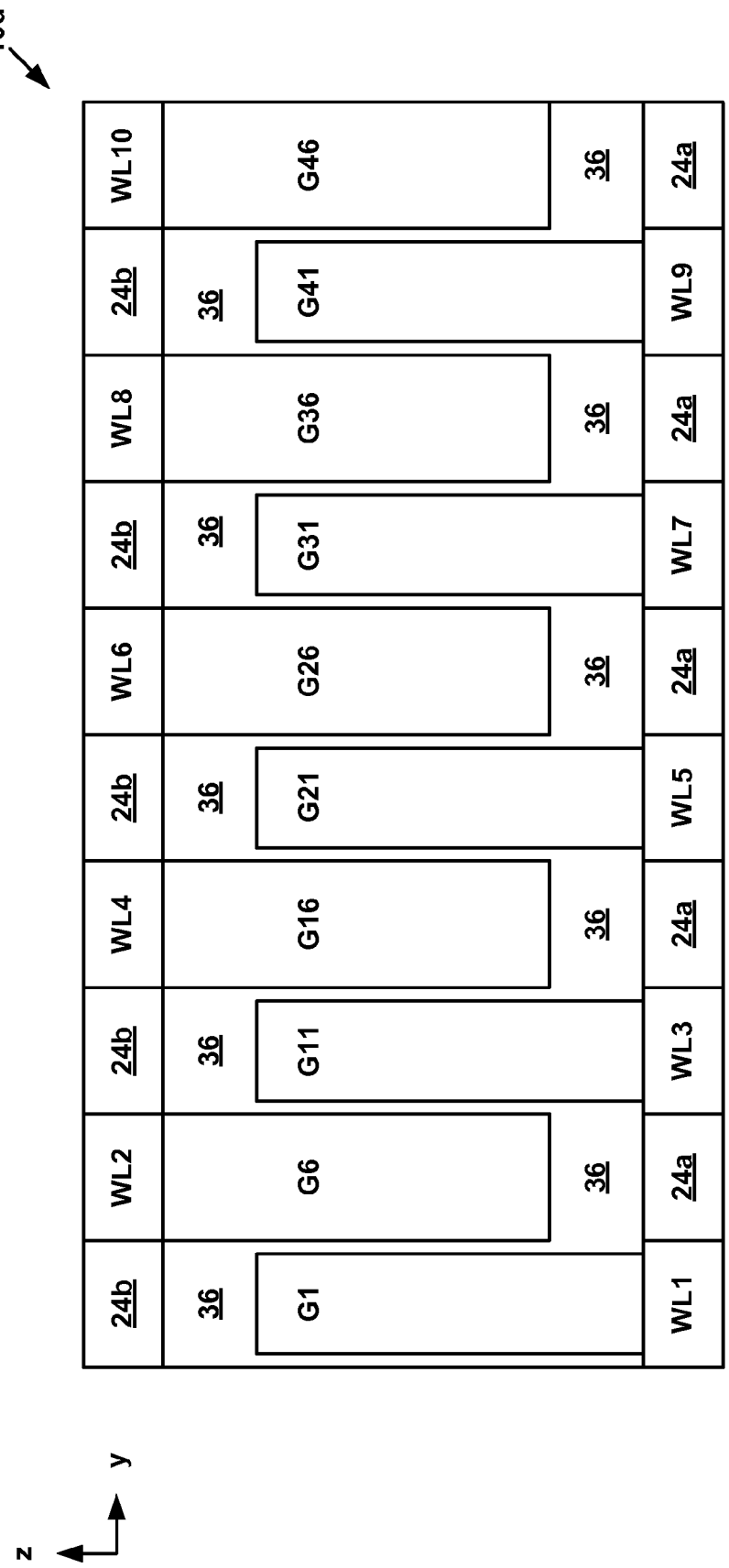
FIGS. 5B-5D are perspective views of the example embodiment of memory array of FIG. 1D.
Figure 5C:
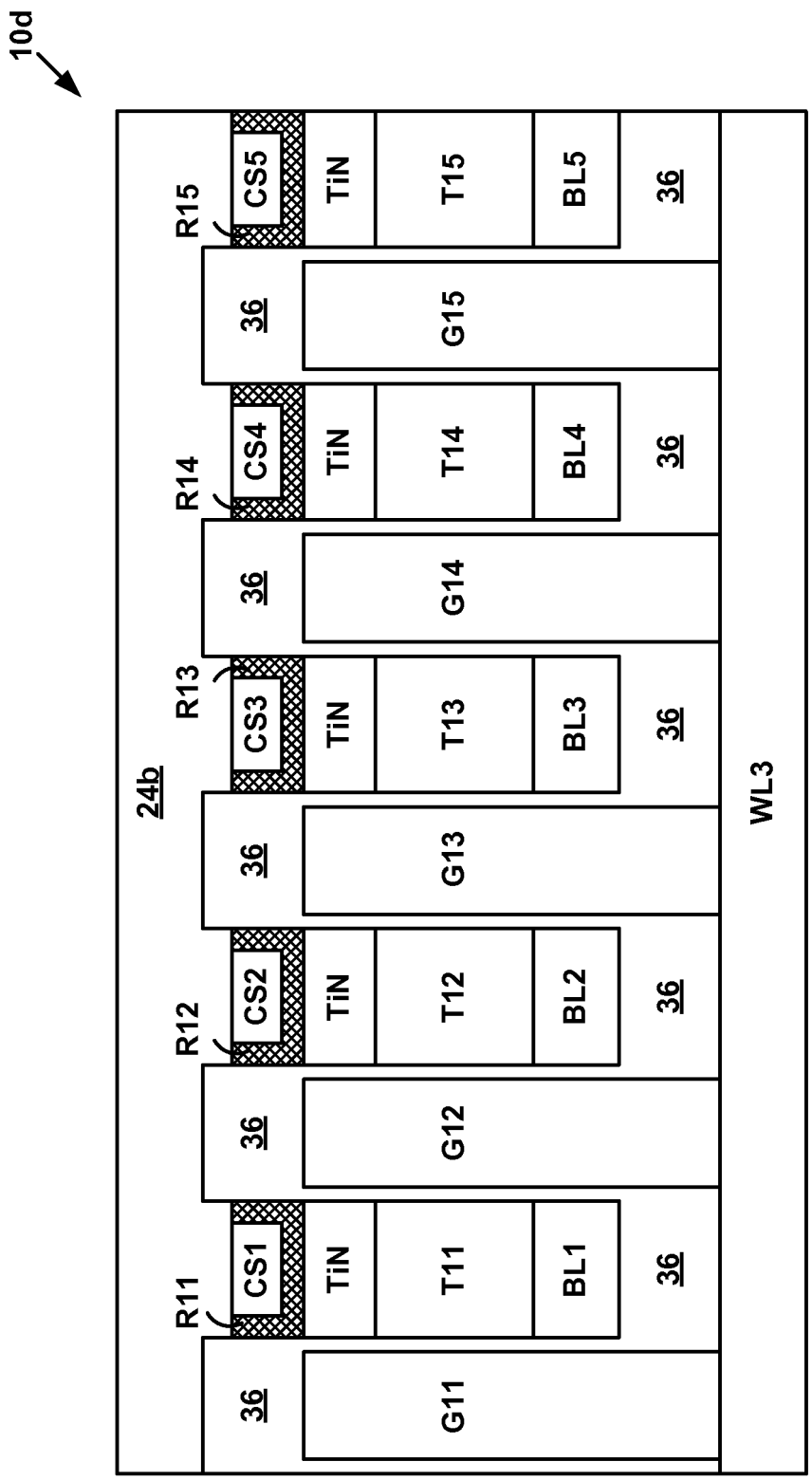

As described above, example memory arrays 10a-10c provide a density of one bit per $A_{cell}=4F^2$ area. FIGS. 5A-5D illustrate an example embodiment of memory array 10d of FIG. 1D in which memory cells are interdigitated to double the bit density of memory cells to two bits per $4F^2$ area. In particular, FIG. 5A illustrates a top view of a portion of memory array 10d, and FIGS. 5B-5C illustrate cross-sectional views of a portion of memory array 10d. As shown in FIG. 5A, word lines WL1, WL2, . . . , WL10 are disposed in parallel along a first axis (e.g., an x-axis), and bit lines BL1, BL2, ..., B5 are disposed in parallel along a second axis (e.g., a y-axis) generally perpendicular to the first axis. One memory cell is formed at the intersection of each word line and each bit line, with each memory cell 12a1, 12a2, ... 12a50 including a vertical transistor T1, T2, ..., T50 coupled in series with a resistivity-switching element R1, R2, ..., R50.

As shown in FIG. 5B, word lines WL1, WL2, ..., WL10 are alternately oriented at top and bottom (along z-axis) of memory array 10d, with consecutive word lines (e.g., WL1 and WL2, WL3 and WL4, etc.) adjacent one another along the y-axis. For example, word lines WL1, WL3, WL5, WL7 and WL9 are separated from one another by dielectric 24a, and connect from the bottom to gates G1, G11, G21, G31 and G41, respectively, whereas word lines WL2, WL4, WL6, WL8 and WL10 are separated from one another by dielectric 24a, and connect from the top to gates G6, G16, G26, G36 and G46, respectively.

Figure 5D:
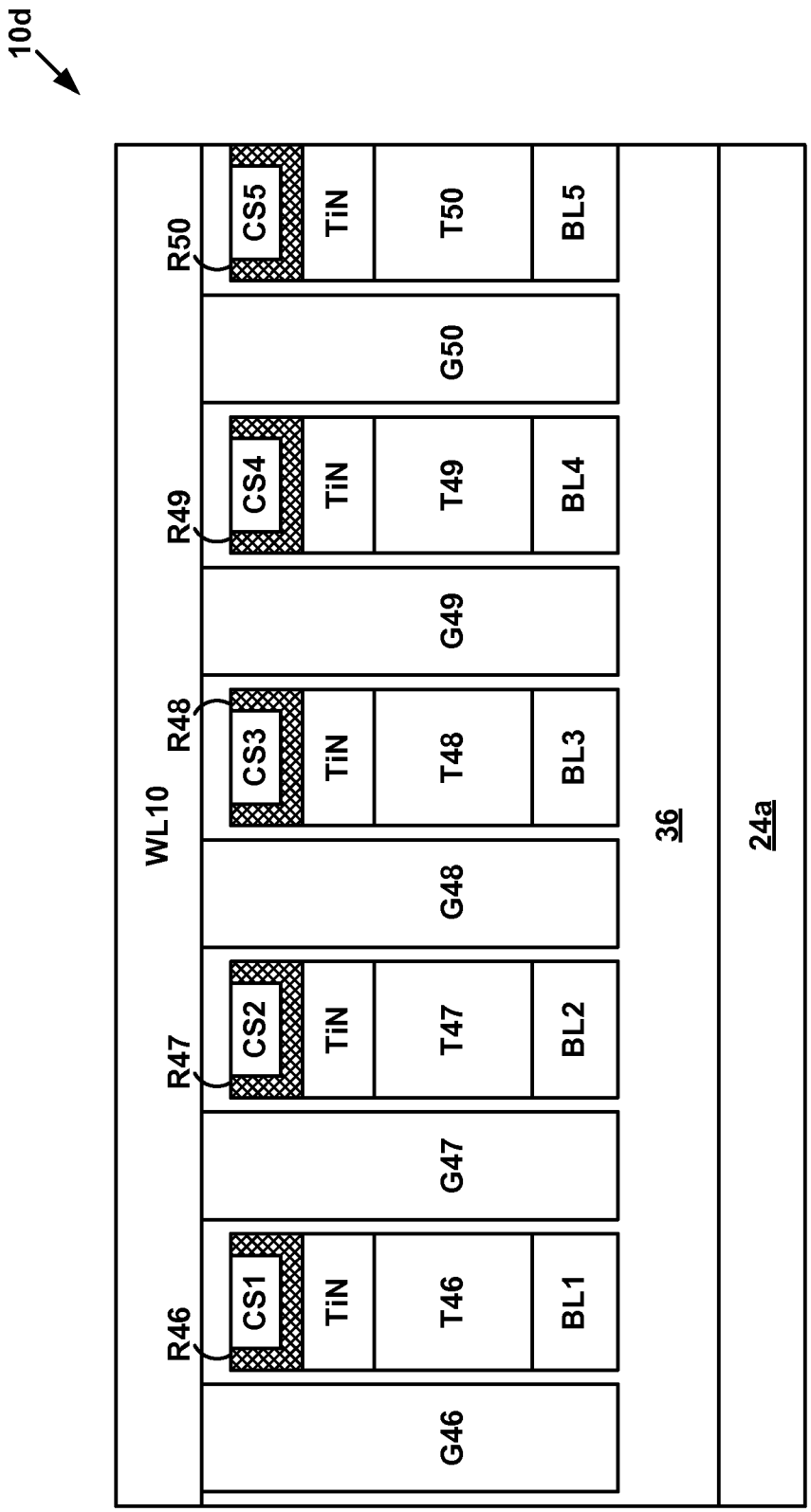

As shown in FIG. 5C, bit lines BL1, BL2, BL3, BL4 and BL5 are separated from lower word lines (e.g., WL3) by gate dielectric layer 36, and are coupled to a drain/source terminal of the vertical transistors (e.g., T11, T12, T13, T14 and T15), which have source/drain terminals coupled to the resistivity-switching elements (e.g., R11, R12, R13, R14 and R15). Common source terminals CS1, CS2, CS3, CS4 and CS5 are formed into rails that are coupled to the resistivity-switching elements (e.g., R11, R12, R13, R14 and R15) and are parallel to bit lines BL1, BL2, BL3, BL4 and BL5. Persons of ordinary skill in the art will understand that bit lines BL1, BL2, BL3, BL4 and BL5 and common source terminals CS1, CS2, CS3, CS4 and CS5 may be interchanged. As shown in FIG. 5D, bit lines BL1, BL2, BL3, BL4 and BL5 are separated from upper word lines (e.g., WL10) by gate dielectric layer 36.

Thus, memory array 10d of FIG. 5A can accommodate twice as many memory cells per area $A_{cell}=4F^2$ compared with memory array 10a of FIG. 2A. Thus, if each memory cell 12a1, 12a2, ... 12a50 of memory array 10d represents a single bit, the density of memory array 10d is two bits per $4F^2$ area (or one bit per $2F^2$ area).

Persons of ordinary skill in the art will understand that only the top portion of the vertical transistors are etched in one direction, so that much of the bodies of the two sets of transistor "pillars" are merged to form a rail. The top source/drain portion of each pillar is all that needs to be patterned, separating the individual bits from each other. Persons of ordinary skill in the art also will understand that memory cell 10d may be produced using four masking steps to form a layer of $2F^2$ bits (twice the density as that formed with three masking steps in the process described in FIGS. 4A1-4I2). Person of ordinary skill in the art also will understand that the upper words line can be shared with a second layer of similar memory cells, resulting in two layers of $2F^2$ bits being formed using seven masking steps.

Thus, as described above, one embodiment includes a memory cell that has a vertical transistor that has a controlling electrode, the controlling electrode coupled to a word line, the word line disposed above or below the vertical transistor, and a resistivity-switching element coupled is series with and disposed above or below the vertical transistor.

One embodiment includes a memory array that includes a plurality of word lines disposed in parallel along a first axis, a plurality of bit lines disposed in parallel along a second axis substantially perpendicular to the first axis, and a plurality of memory cells, each memory cell formed at an intersection of one of the word lines and one of the bit lines, each memory cell comprising a vertically-oriented pillar-shaped transistor coupled in series with and disposed above or below a resistivity-switching element, each vertical transistor having a controlling electrode coupled to one of the word lines.

One embodiment includes a method of forming a memory array, the method including using three masking steps to form a plurality of memory cells, each memory cell formed at an intersection of one of a plurality of word lines and one of a plurality of bit lines, each memory cell comprising a vertically-oriented pillar-shaped transistor coupled in series with and disposed above or below a resistivity-switching element.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

What is claimed is:

1. A memory cell comprising:
   a vertically-oriented pillar-shaped transistor comprising a controlling electrode, the controlling electrode coupled to a word line that is disposed above or below the vertically-oriented pillar-shaped transistor; and
   a resistivity-switching element coupled in series with and disposed above or below the vertically-oriented pillar-shaped transistor.

2. The memory cell of claim 1, wherein the controlling electrode is disposed on a sidewall of the vertically-oriented pillar-shaped transistor.

3. The memory cell of claim 1, wherein the vertically-oriented pillar-shaped transistor comprises:
   a first terminal coupled to a bit line;
   a second terminal comprising the controlling electrode coupled to a word line; and
   a third terminal coupled to the resistivity-switching element.

4. The memory cell of claim 1, wherein the vertically-oriented pillar-shaped transistor comprises:
   a first terminal coupled via the resistivity-switching element to a bit line;
   a second terminal comprising the controlling electrode coupled to a word line; and
   a third terminal coupled to ground.

5. The memory cell of claim 1, wherein the vertically-oriented pillar-shaped transistor comprises one or more of silicon, germanium, a silicon-germanium alloy, and a wide band-gap semiconductor material.

6. The memory cell of claim 1, wherein the vertically-oriented pillar-shaped transistor comprises a field effect transistor.

7. The memory cell of claim 1, wherein the vertically-oriented pillar-shaped transistor comprises a first region having a first conductivity type, a second region having a second conductivity type above the first region, and a third region having the first conductivity type above the second region.

8. The memory cell of claim 7, wherein the first region comprises a drain/source region of the vertically-oriented pillar-shaped transistor, the second region comprises a body region of the vertically-oriented pillar-shaped transistor, and the third region comprises a source/drain region of the vertically-oriented pillar-shaped transistor.

9. The memory cell of claim 1, wherein the vertically-oriented pillar-shaped transistor comprises a junctionless field effect transistor.

10. The memory cell of claim 1, wherein the resistivity-switching element comprises a metal oxide.

11. The memory cell of claim 1, wherein the resistivity-switching element comprises one or more of NiO, $Nb_2O_5$, $TiO_2$, $HfO_2$, $Al_2O_3$, $MgO_x$, $CrO_2$, VO, BN, $TaO_2$, $Ta_2O_5$, and AlN.

12. A memory array comprising:
   a plurality of word lines disposed in parallel along a first axis;
   a plurality of bit lines disposed in parallel along a second axis substantially perpendicular to the first axis; and
   a plurality of memory cells, each memory cell formed at an intersection of one of the word lines and one of the bit lines, each memory cell comprising a vertically-oriented pillar-shaped transistor coupled in series with and disposed above or below a resistivity-switching element, each vertical transistor having a controlling electrode coupled to one of the word lines.

13. The memory array of claim 12, wherein the bit lines are disposed above the word lines, the vertically-oriented pillar-shaped transistors are disposed above the bit lines, and the resistivity-switching elements are disposed above the vertically-oriented pillar-shaped transistors.

14. The memory array of claim 12, wherein the vertically-oriented pillar-shaped transistors are disposed above the resistivity-switching elements, the bit lines are disposed above the vertically-oriented pillar-shaped transistors, and the word lines disposed above the bit lines.

15. The memory array of claim 12, wherein each controlling electrode is disposed between two of the vertically-oriented pillar-shaped transistors, and wherein each pair of controlling electrodes disposed on opposite-facing sidewalls of one of the vertically-oriented pillar-shaped transistors are coupled to the same word line.

16. The memory array of claim 12, wherein the vertically-oriented pillar-shaped transistors comprise one or more of silicon, germanium, a silicon-germanium alloy, and a wide band-gap semiconductor material.

17. The memory array of claim 12, wherein the vertically-oriented pillar-shaped transistors comprise field effect transistors.

18. The memory array of claim 12, wherein each of the vertically-oriented pillar-shaped transistors comprises a first region having a first conductivity type, a second region having a second conductivity type above the first region, and a third region having the first conductivity type above the second region.

19. The memory array of claim 18, wherein the first region comprises a drain/source region of the vertical transistor, the second region comprises a body region of the vertical transistor, and the third region comprises a source/drain region of the vertical transistor.

20. The memory array of claim 12, wherein the vertically-oriented pillar-shaped transistors comprise junctionless field effect transistors.

21. The memory array of claim 12, wherein the resistivity-switching elements comprise a metal oxide.

22. The memory array of claim 12, wherein the resistivity-switching elements comprise one or more of NiO, $Nb_2O_5$, $TiO_2$, $HfO_2$, $Al_2O_3$, $MgO_x$, $CrO_2$, VO, BN, $TaO_2$, $Ta_2O_5$, and AlN.

23. A method of forming a memory array, the method comprising:
   using three masking steps to form a plurality of memory cells, each memory cell formed at an intersection of one of a plurality of word lines and one of a plurality of bit lines, each memory cell comprising a vertically-oriented pillar-shaped transistor coupled in series with and disposed above or below a resistivity-switching element.

24. The method of claim 23, further comprising forming the bit lines above the word lines, the vertically-oriented pillar-shaped transistors above the bit lines, and the resistivity-switching elements above the vertically-oriented pillar-shaped transistors.

25. The method of claim 23, further comprising forming the vertically-oriented pillar-shaped transistors above the resistivity-switching elements, the bit lines above the vertically-oriented pillar-shaped transistors, and the word lines above the bit lines.

26. The method of claim 23, further comprising forming a plurality of controlling electrodes, each controlling electrode disposed between two of the vertically-oriented pillar-shaped transistors and coupled to one of the word lines, wherein each pair of controlling electrodes disposed on opposite-facing sidewalls of one of the vertically-oriented pillar-shaped transistors are coupled to the same word line.

27. The method of claim 23, wherein the vertically-oriented pillar-shaped transistors comprise one or more of silicon, germanium, a silicon-germanium alloy, and a wide band-gap semiconductor material.

28. The method of claim 23, wherein the vertically-oriented pillar-shaped transistors comprise field effect transistors.

29. The method of claim 23, wherein each of the vertically-oriented pillar-shaped transistors comprises a first region having a first conductivity type, a second region having a second conductivity type above the first region, and a third region having the first conductivity type above the second region.

30. The method of claim 29, wherein the first region comprises a drain/source region of the vertical transistor, the second region comprises a body region of the vertical transistor, and the third region comprises a source/drain region of the vertical transistor.

31. The method of claim 23, wherein the vertically-oriented pillar-shaped transistors comprise junctionless field effect transistors.

32. The method of claim 23, wherein the resistivity-switching elements comprise a metal oxide.

33. The method of claim 23, wherein the resistivity-switching elements comprise one or more of NiO, $Nb_2O_5$, $TiO_2$, $HfO_2$, $Al_2O_3$, $MgO_x$, $CrO_2$, VO, BN, $TaO_2$, $Ta_2O_5$, and AlN.

* * * * *